US012648334B2

(12) United States Patent　　(10) Patent No.:　US 12,648,334 B2

Fukuda　　(45) Date of Patent:　Jun. 2, 2026

(54) DISPLAY DEVICE AND MANUFACTURING METHOD THEREOF

(71) Applicant: Magnolia White Corporation, Tokyo (JP)

(72) Inventor: Kaichi Fukuda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 455 days.

(21) Appl. No.: 18/483,536

(22) Filed: Oct. 10, 2023

(65) Prior Publication Data

US 2024/0179997 A1　May 30, 2024

(30) Foreign Application Priority Data

Nov. 29, 2022　(JP) ................................. 2022-189979

(51) Int. Cl.
H10K 59/80 (2023.01)
H10K 59/12 (2023.01)
H10K 102/10 (2023.01)

(52) U.S. Cl.
CPC ... H10K 59/80517 (2023.02); H10K 59/1201 (2023.02); H10K 59/8052 (2023.02); H10K 59/8731 (2023.02); H10K 2102/103 (2023.02)

(58) Field of Classification Search
CPC ......... H10K 59/80517; H10K 59/1201; H10K 59/8052; H10K 59/8731; H10K 2102/103
See application file for complete search history.

(56) References Cited

U.S. PATENT DOCUMENTS

| | | | | |
|---|---|---|---|---|
| 5,888,678 | A * | 3/1999 | Tzu ............................ | G03F 1/29 |
| | | | | 430/5 |
| 8,647,991 | B1 * | 2/2014 | Liu ..................... | H10W 20/088 |
| | | | | 438/692 |
| 9,117,929 | B2 * | 8/2015 | Wirbeleit ........... | H10D 84/0167 |
| 10,354,874 | B2 * | 7/2019 | Huang ................ | H10P 76/4085 |
| 2004/0160170 | A1 | 8/2004 | Sato et al. | |
| 2009/0009069 | A1 | 1/2009 | Takata | |
| 2019/0363275 | A1 | 11/2019 | Ochi et al. | |
| 2022/0077251 | A1 | 3/2022 | Choung et al. | |

FOREIGN PATENT DOCUMENTS

| | | |
|---|---|---|
| JP | H09-197435 A | 7/1997 |
| JP | 2000-195677 A | 7/2000 |
| JP | 2004-207217 A | 7/2004 |
| JP | 2008-135325 A | 6/2008 |
| JP | 2009-032673 A | 2/2009 |
| JP | 2010-118191 A | 5/2010 |
| WO | 2018/179308 A1 | 10/2018 |

* cited by examiner

*Primary Examiner* — Anne M Hines
(74) *Attorney, Agent, or Firm* — XSENSUS LLP

(57)　　ABSTRACT

According to one embodiment, a manufacturing method of a display device includes forming a first conductive oxide layer, forming a first metal layer at a first pressure, forming a second metal layer at a second pressure, forming a second conductive oxide layer, forming a resist having a predetermined shape, etching the second conductive oxide layer using the resist as a mask, retracting an end portion of the second metal layer relative to an end portion of the second conductive oxide layer and an edge of a lower surface of the first metal layer by etching the second metal layer and the first metal layer using the resist as a mask, etching the first conductive oxide layer using the resist as a mask, and removing the resist.

20 Claims, 23 Drawing Sheets

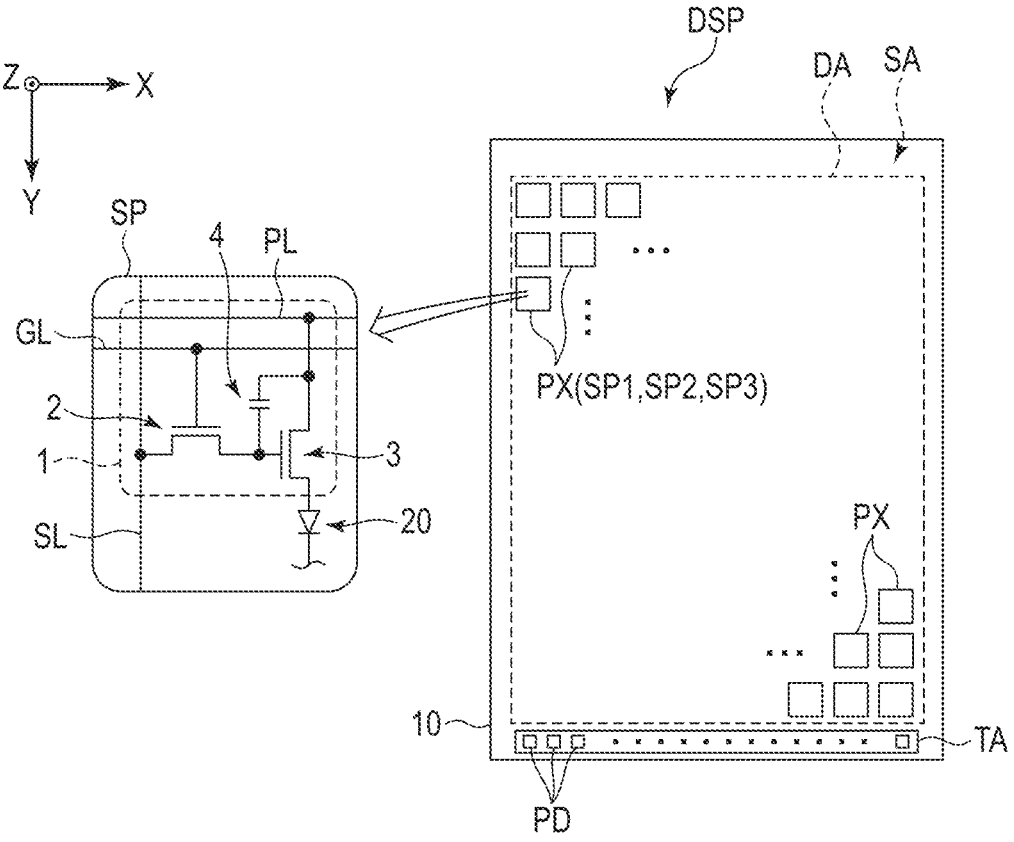
F I G. 1

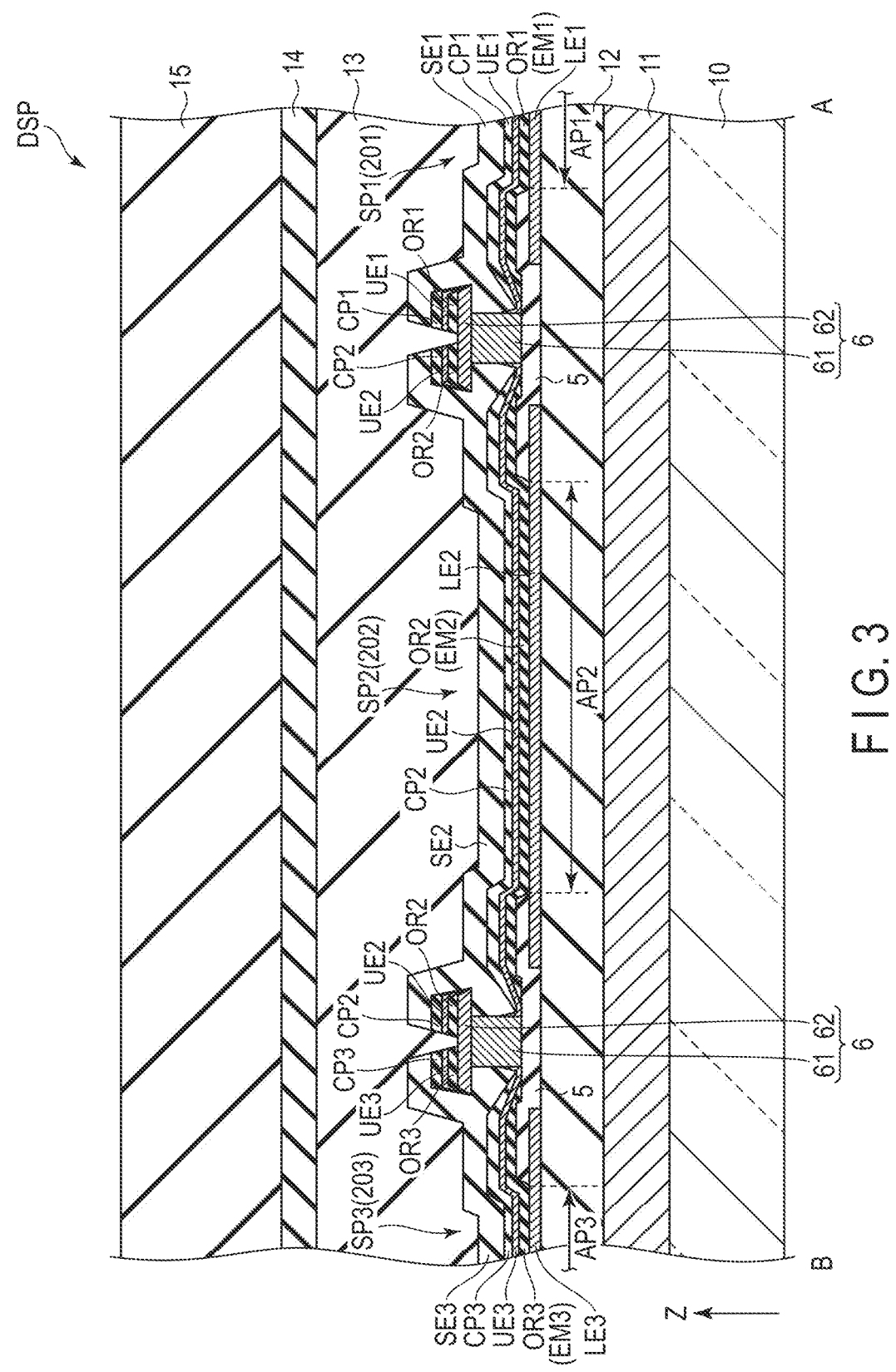
F I G. 3

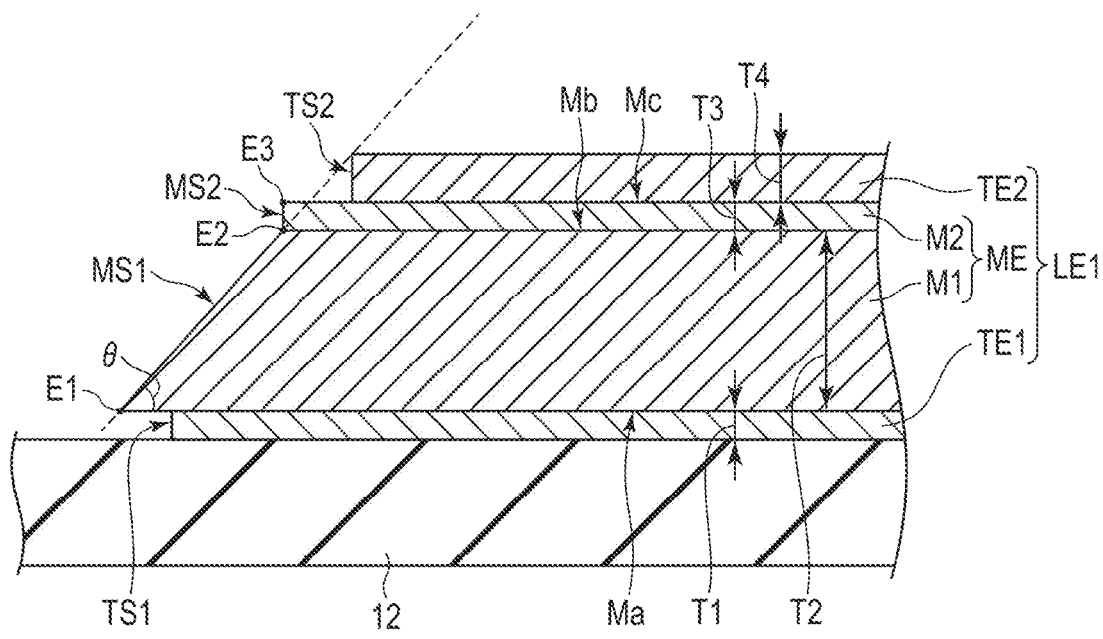
F I G. 5

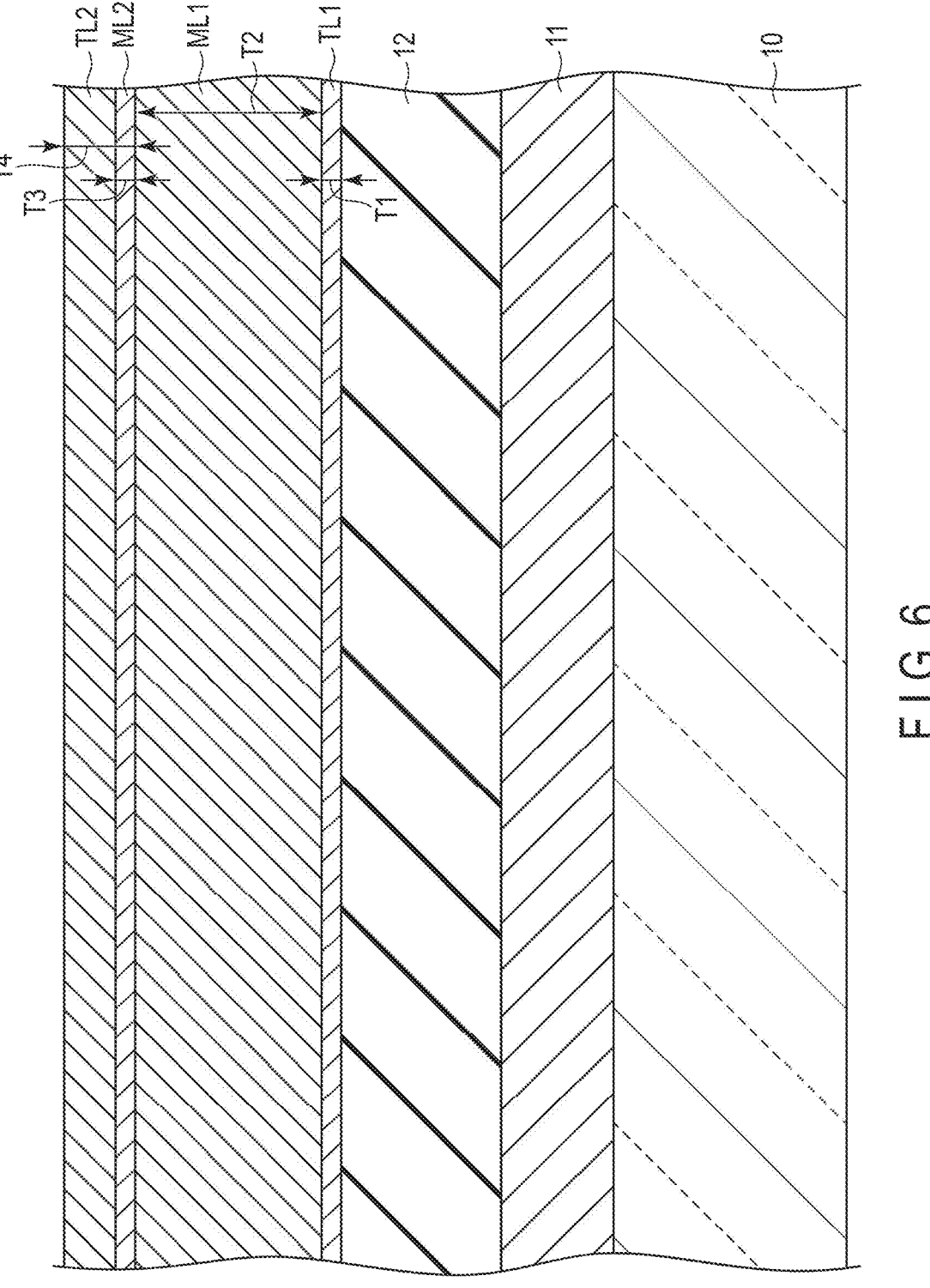
F I G. 6

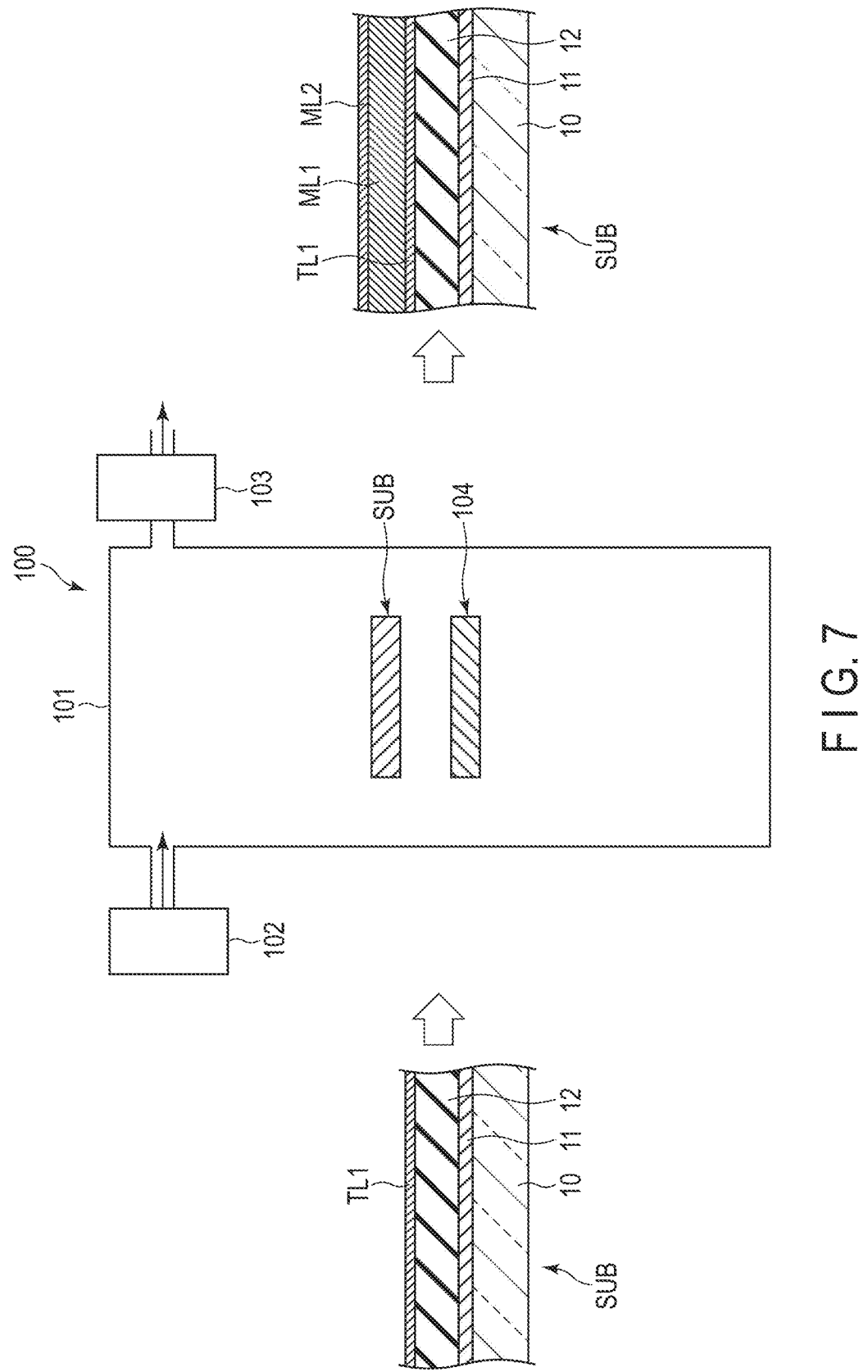
F I G. 7

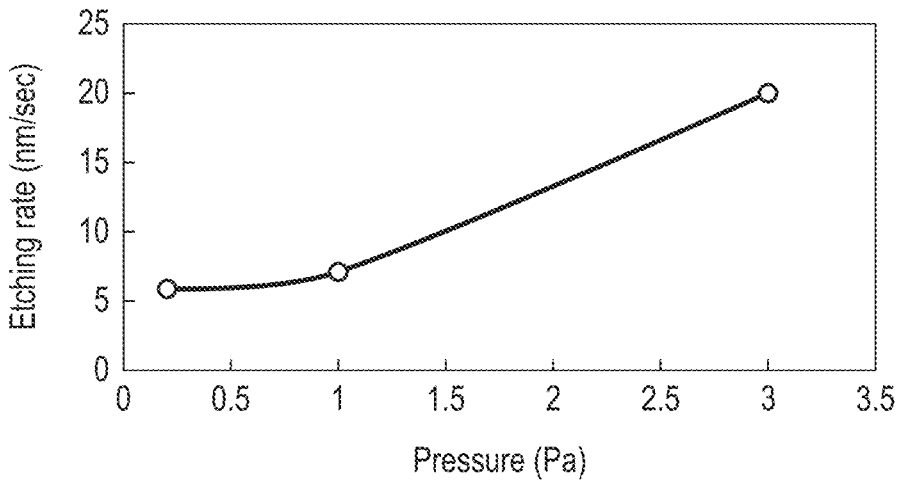
F I G. 8
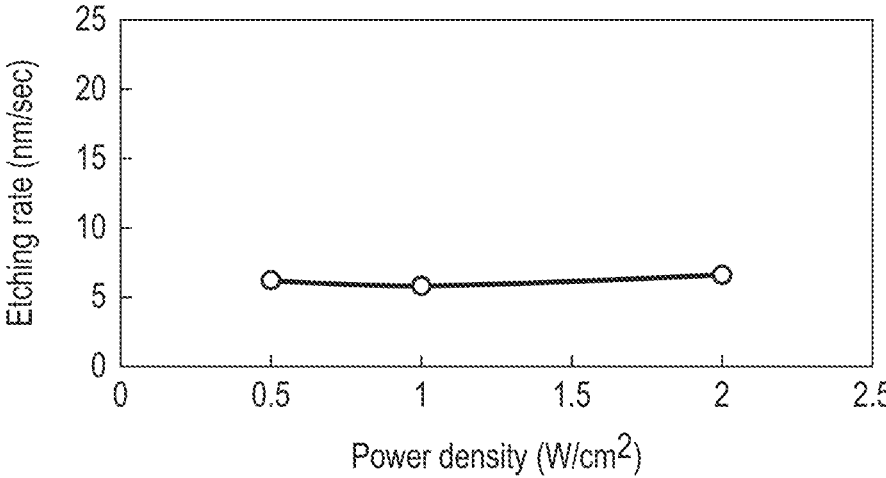
F I G. 9

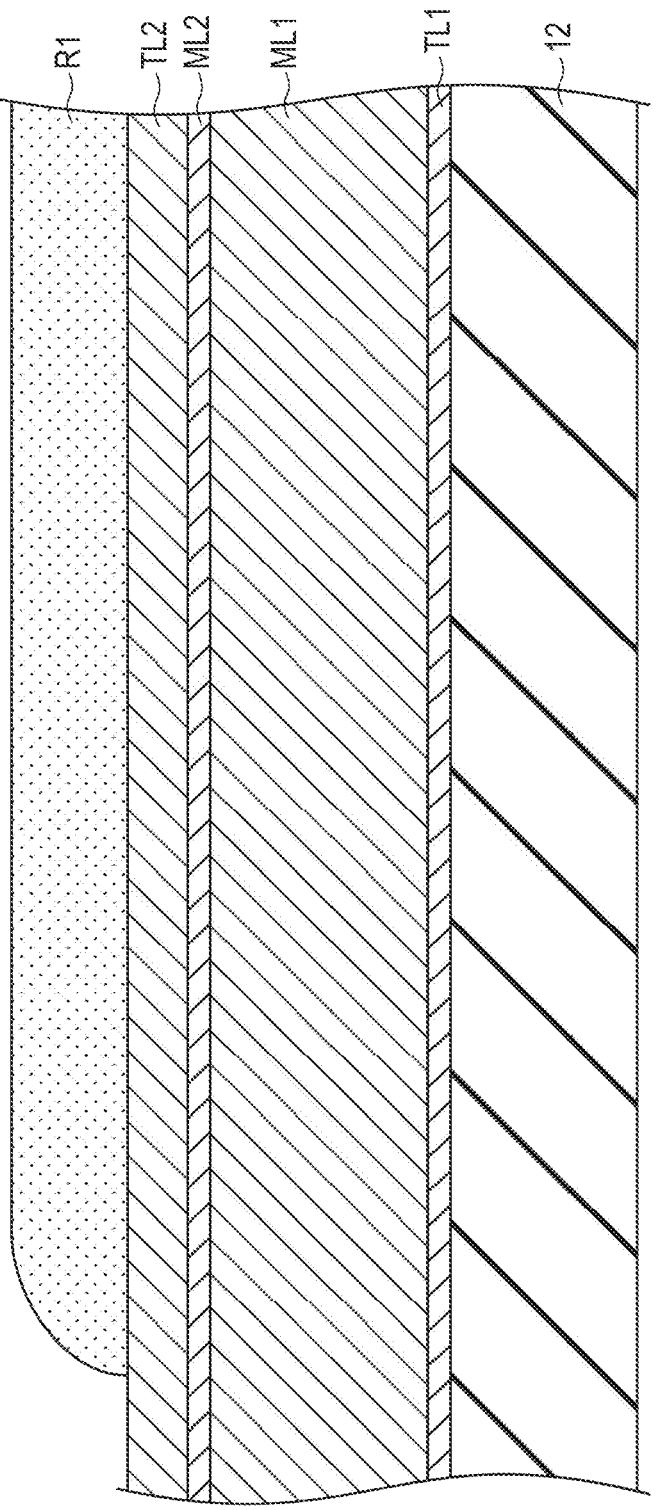
F I G. 10

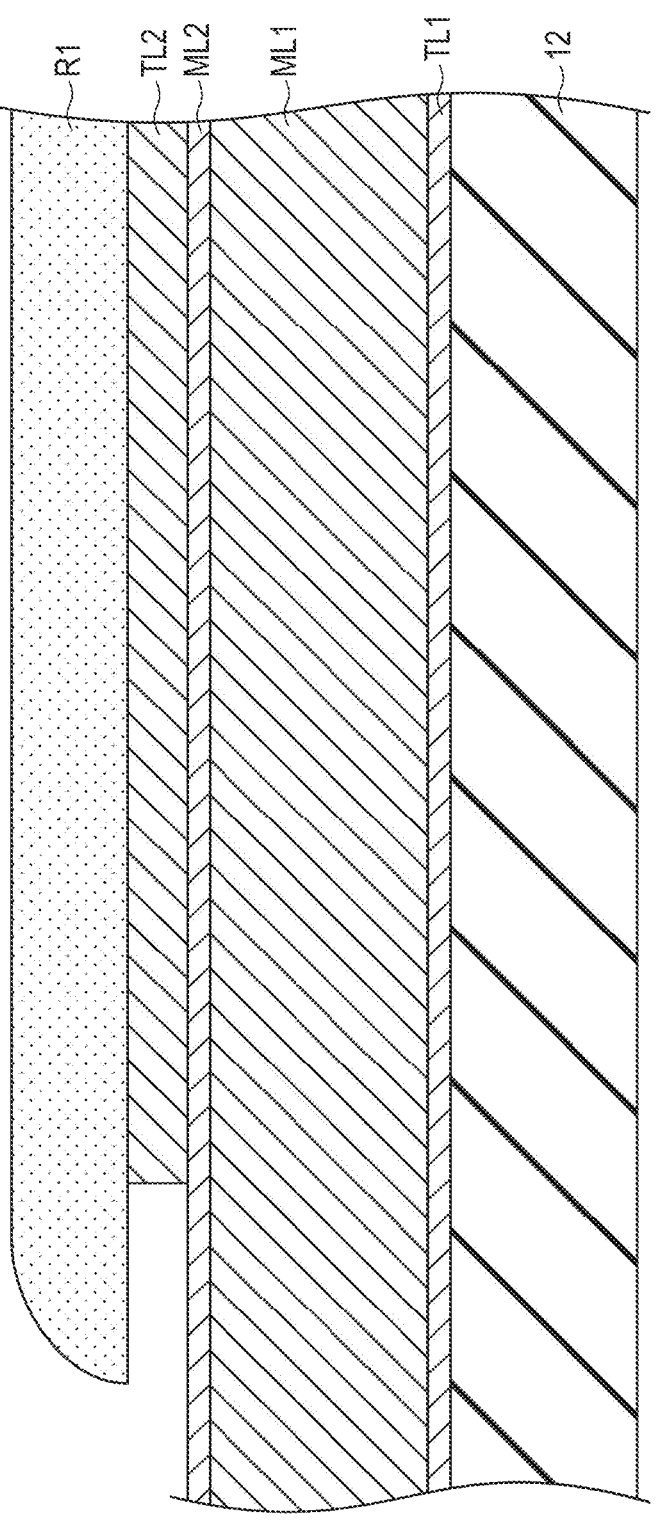
F I G. 11

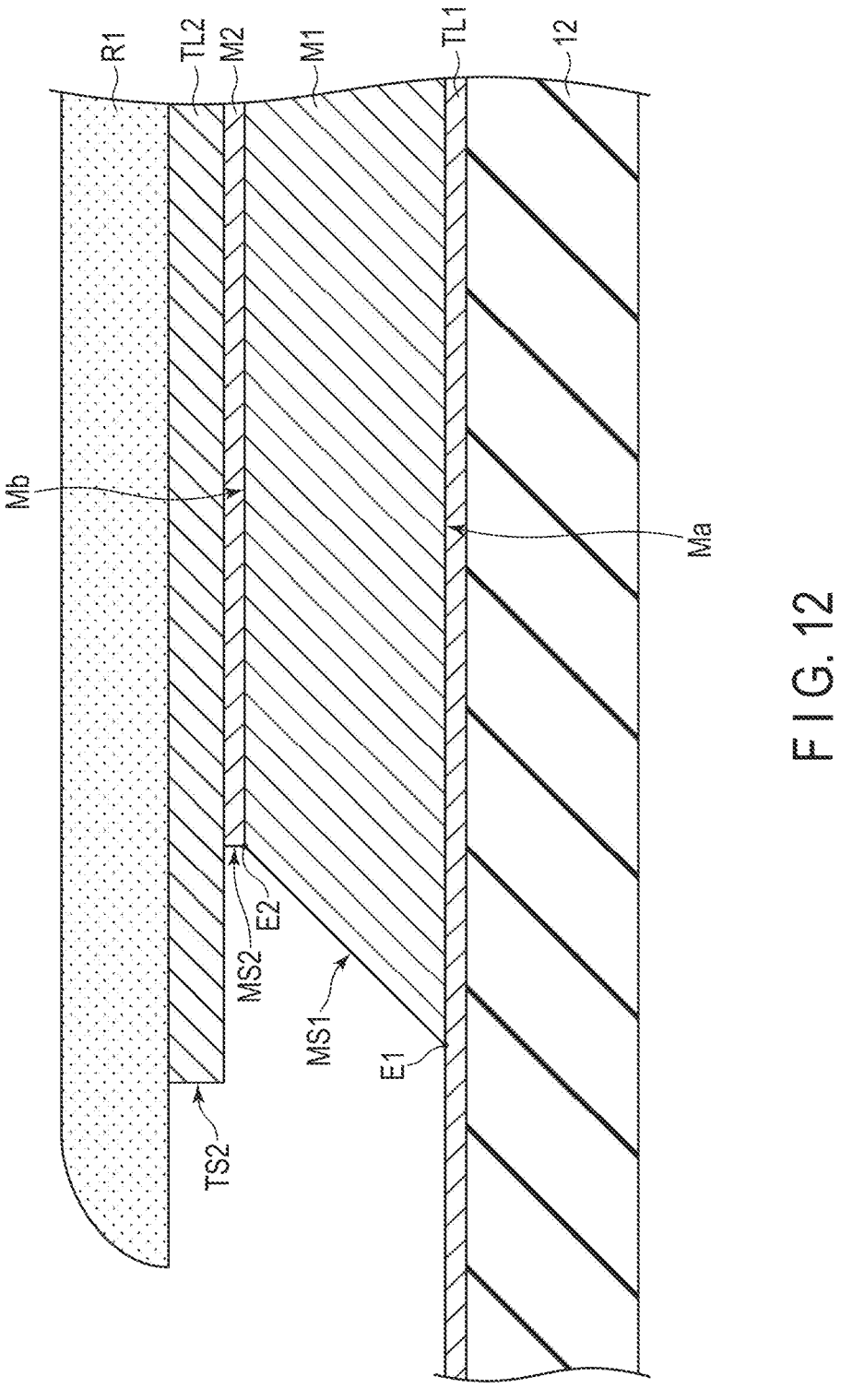
F I G. 12

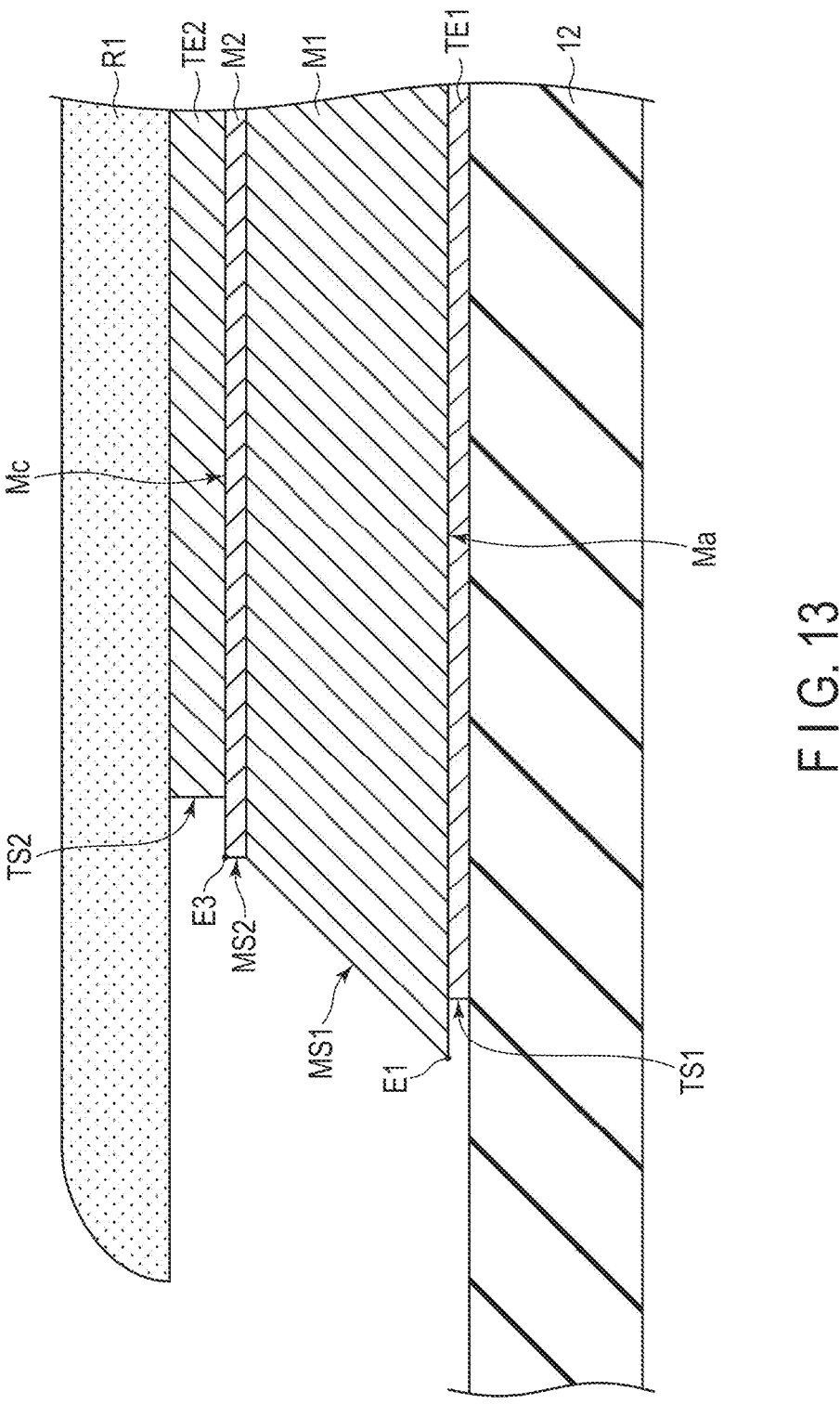
F I G. 13

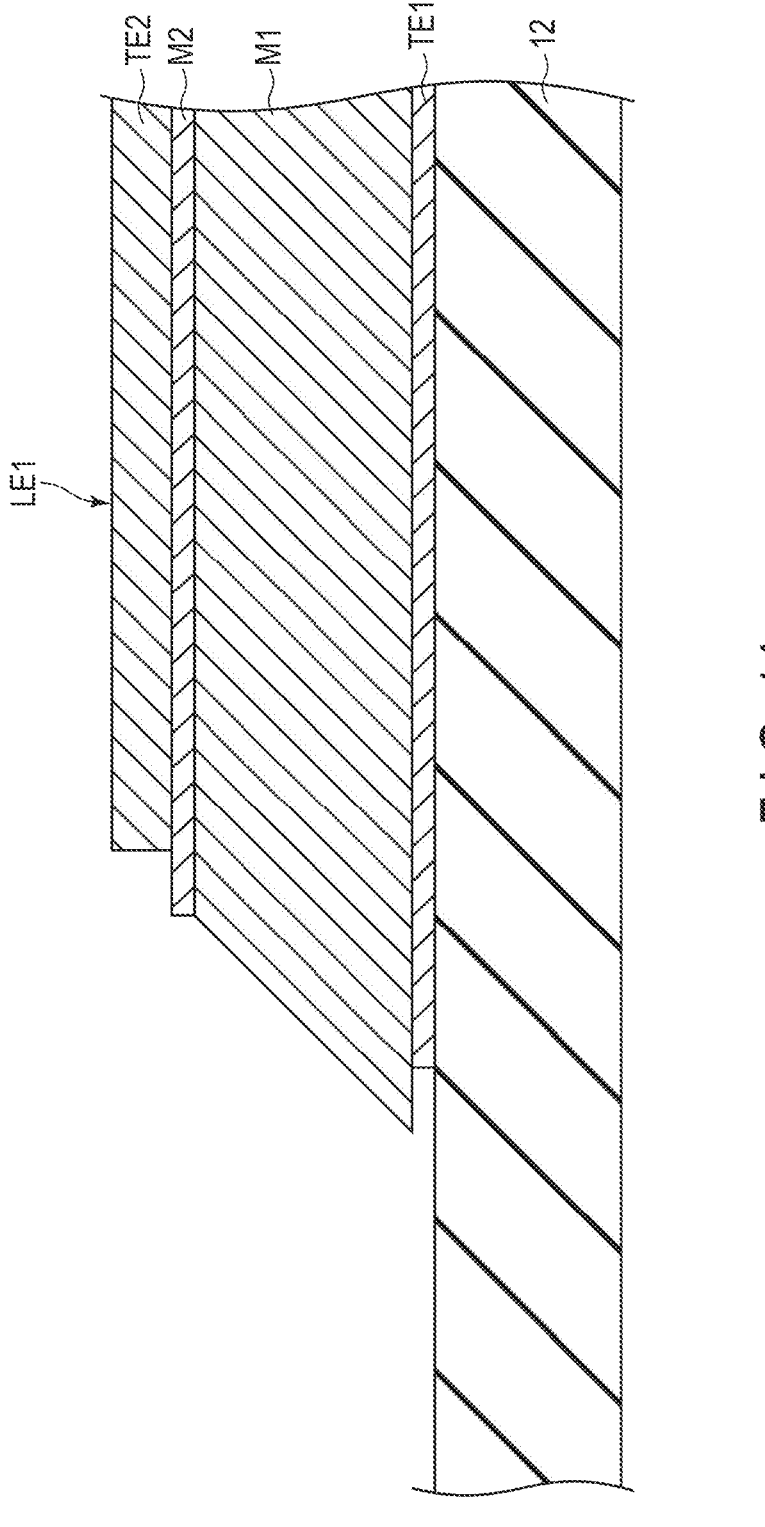
F I G. 14

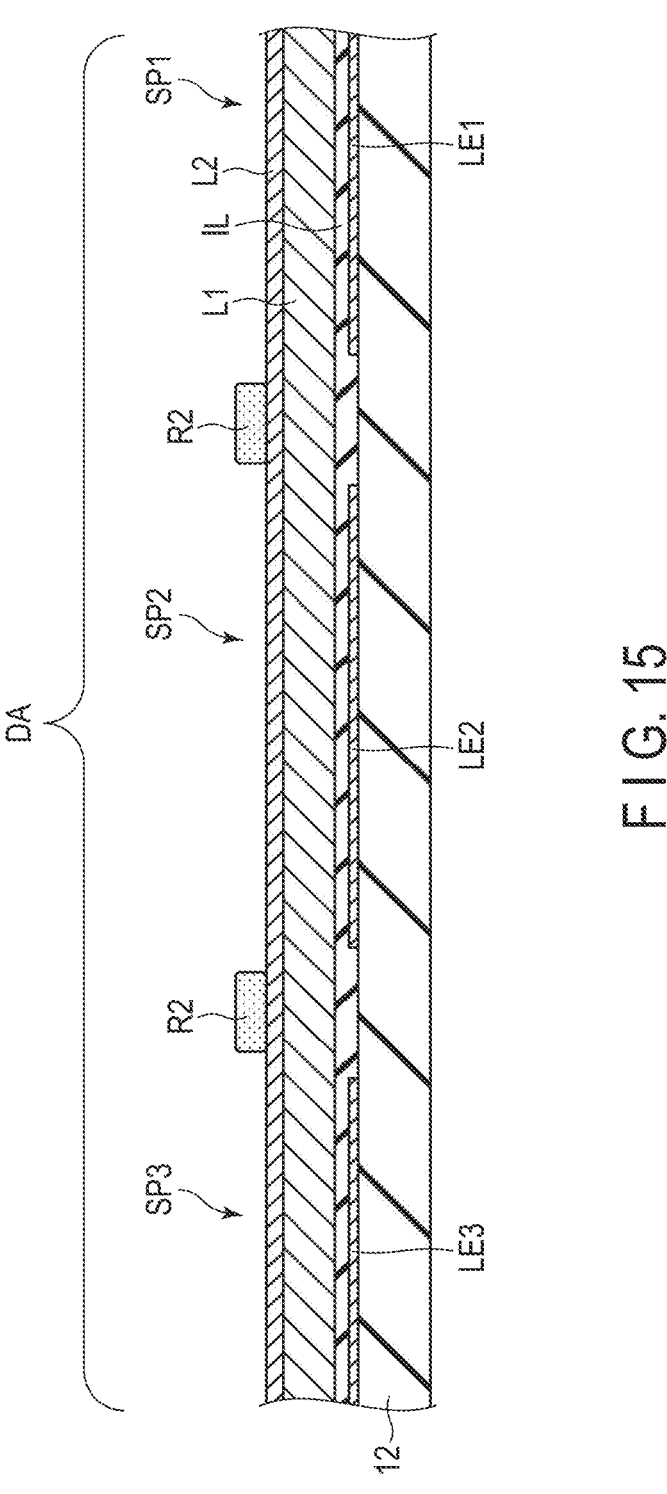
F I G. 15

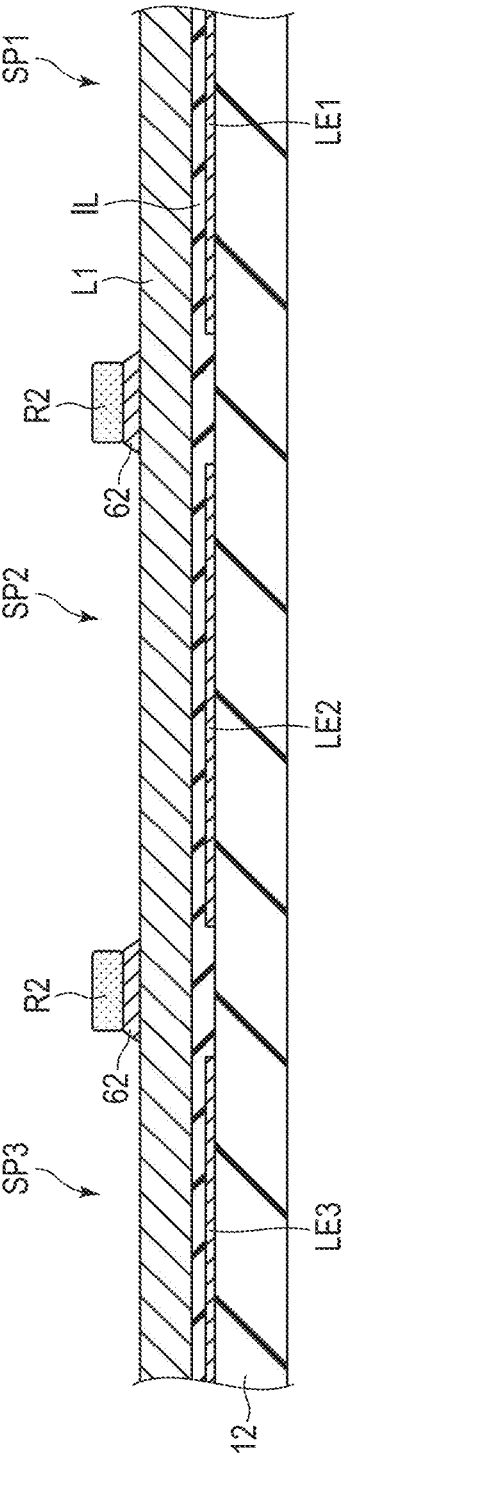
F I G. 16

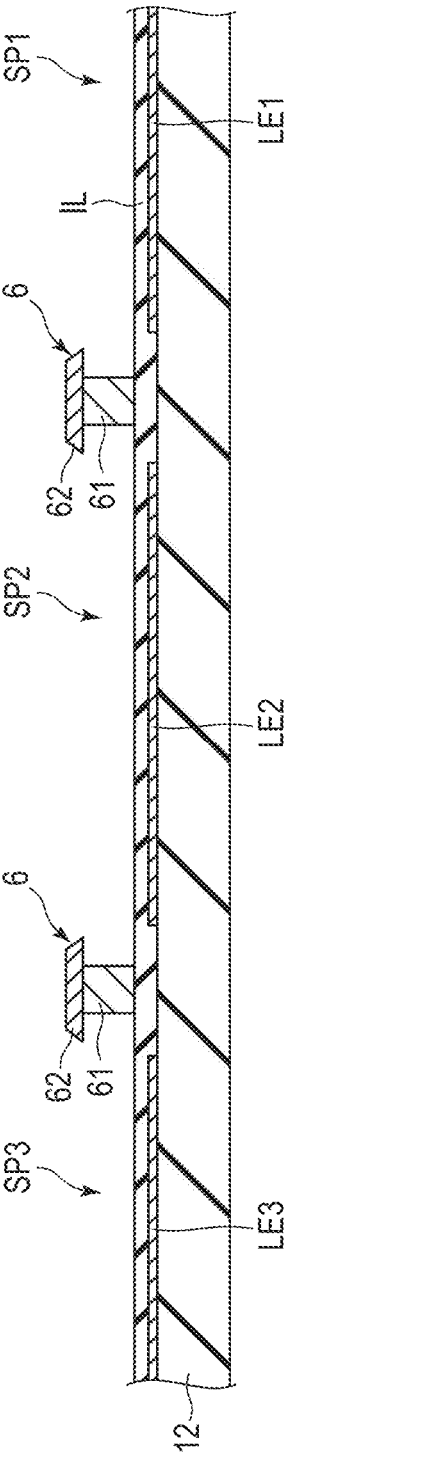
F I G. 17

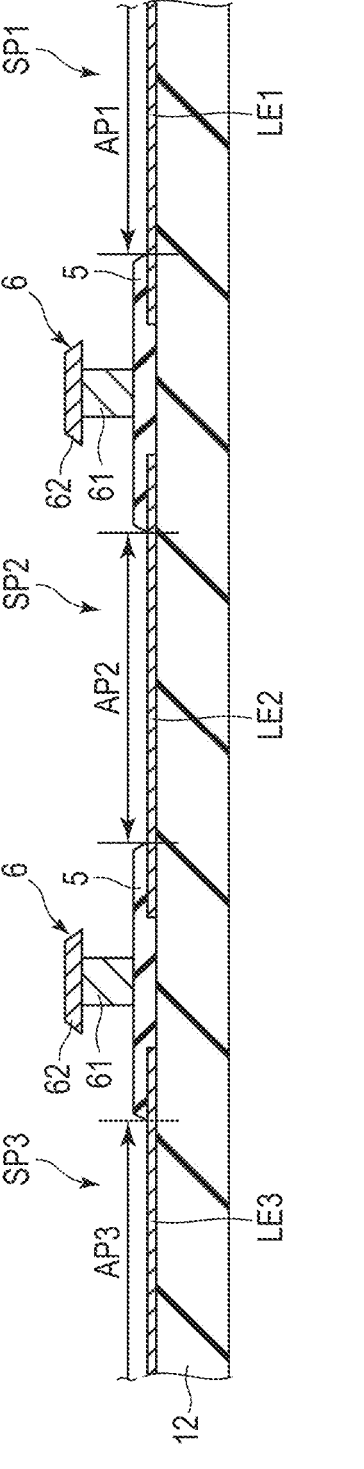
F I G. 18

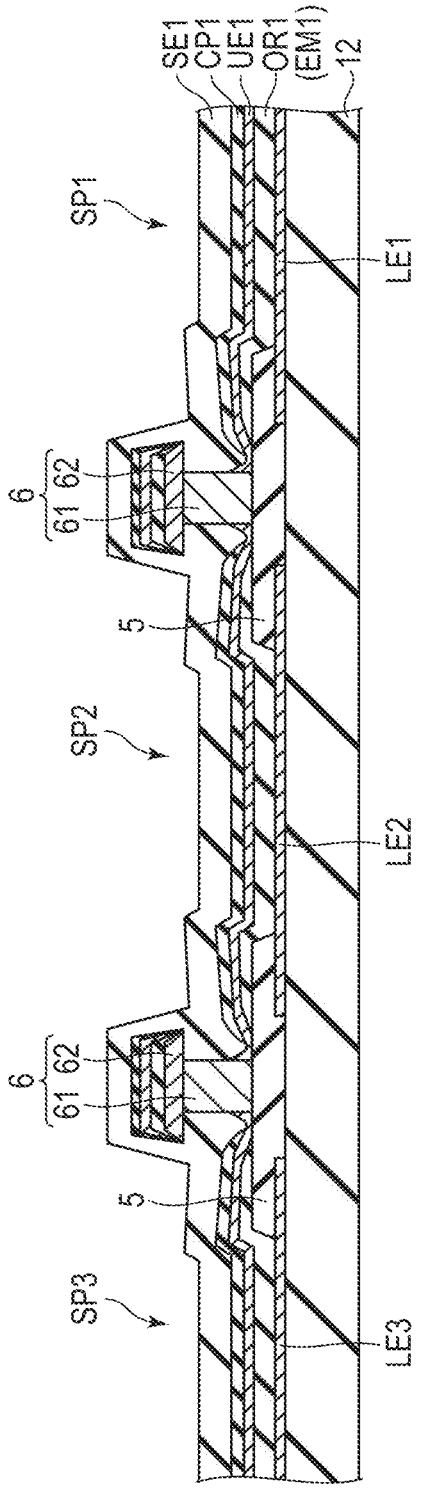
F I G. 19

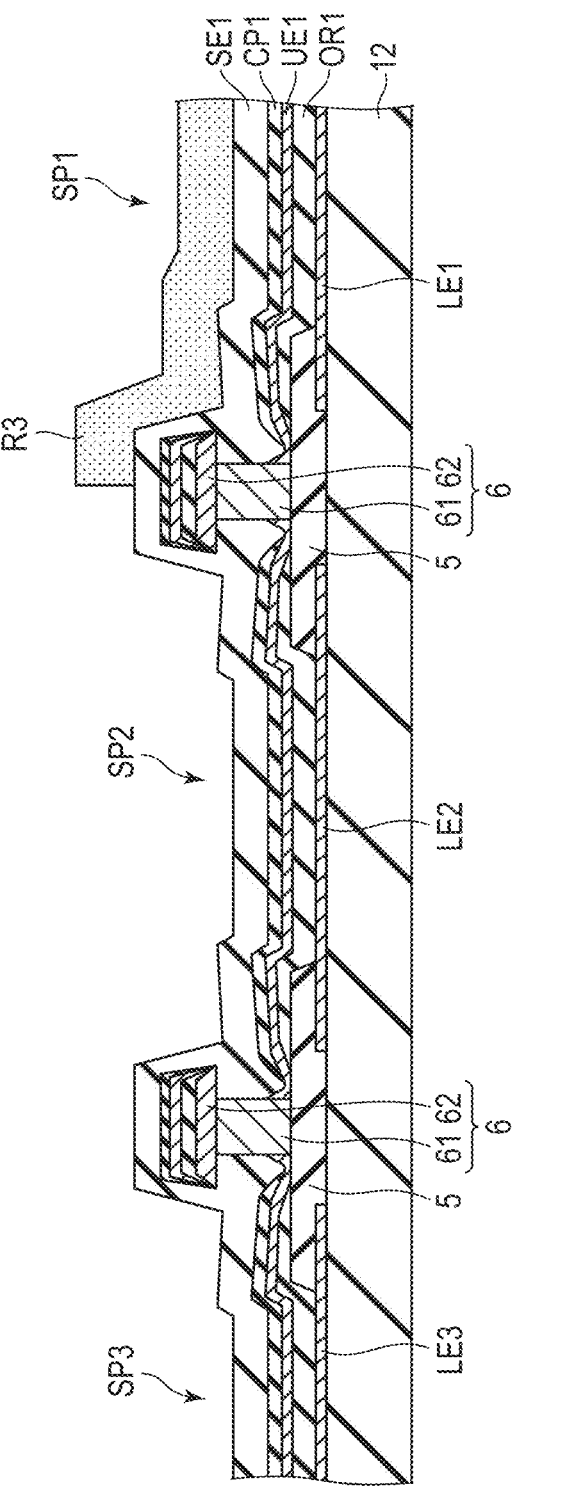
F I G. 20

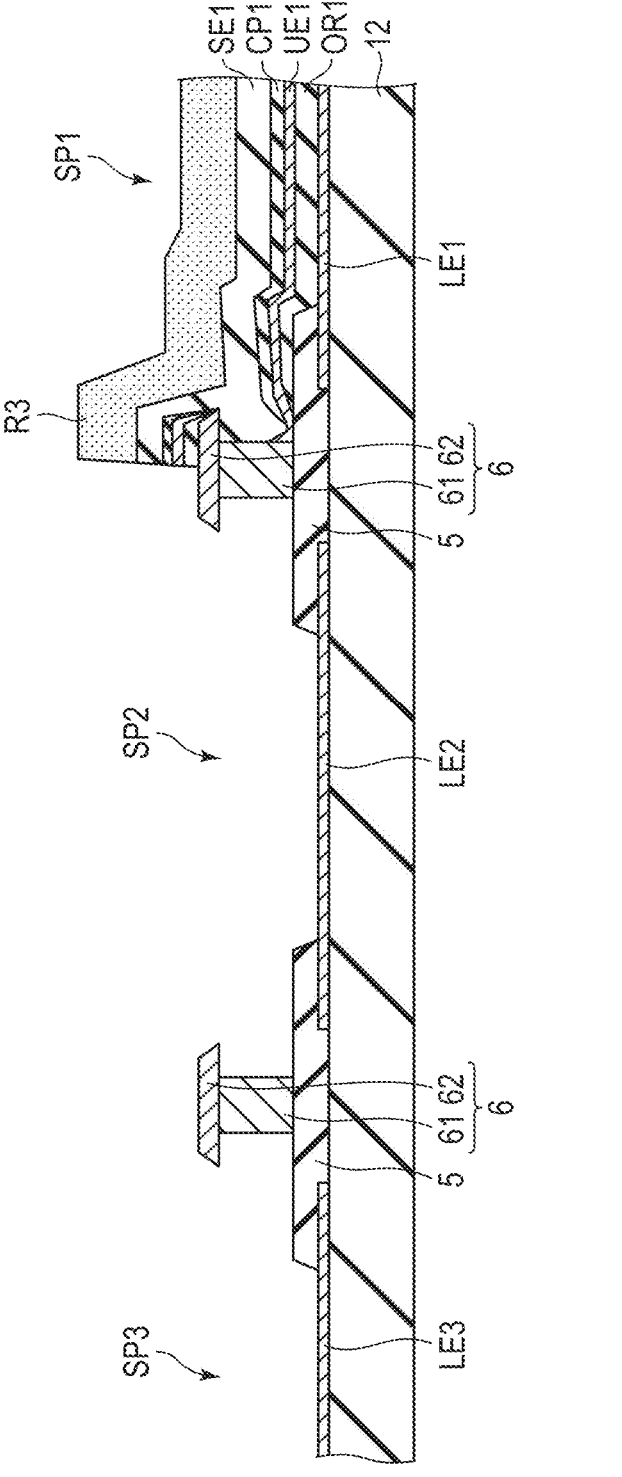
F I G. 21

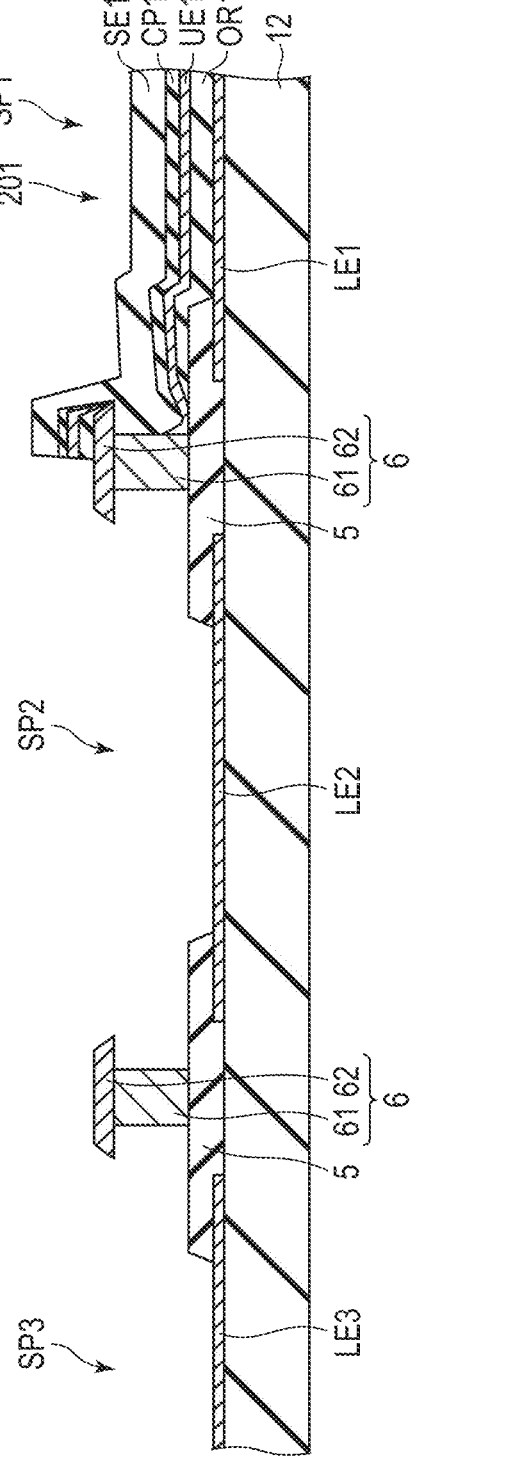
F I G. 22

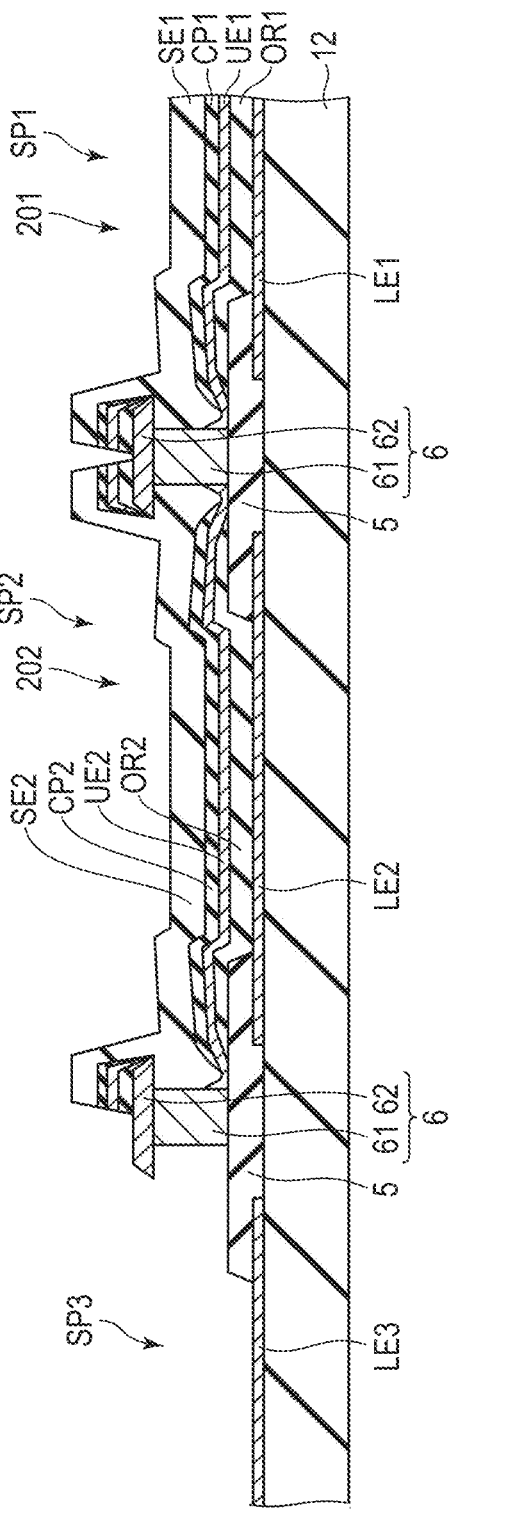
F I G. 23

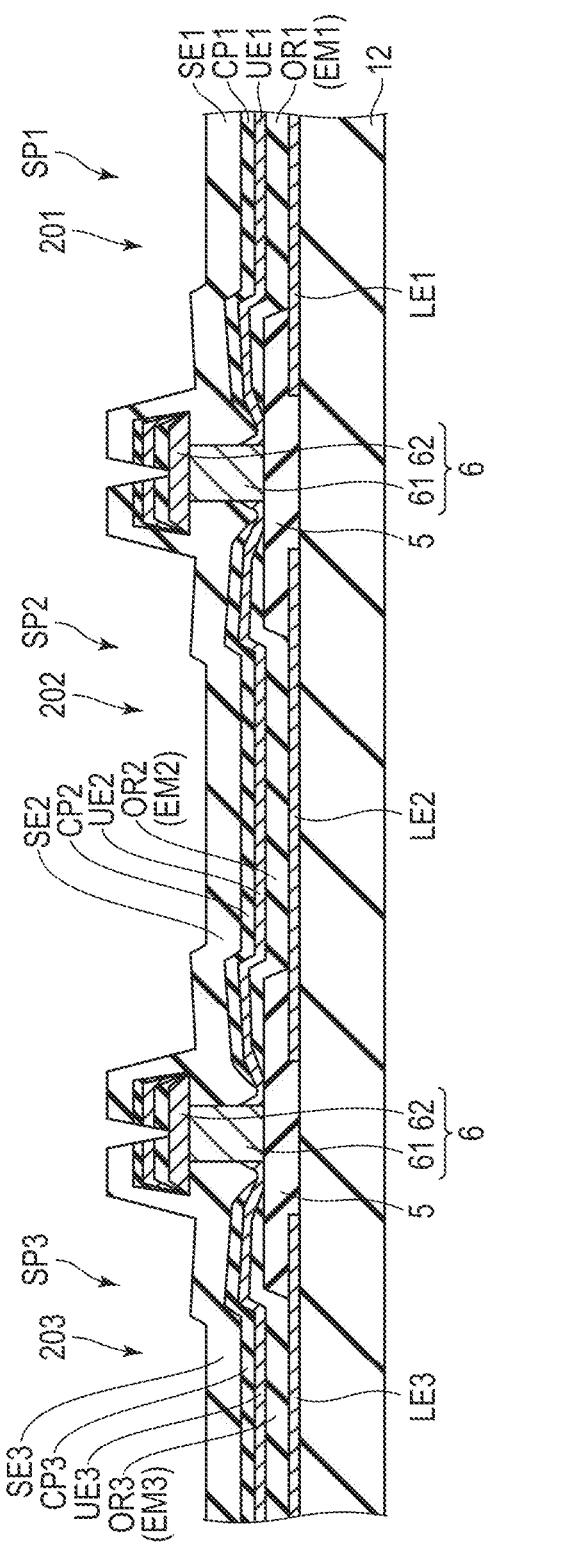
F I G. 24

DISPLAY DEVICE AND MANUFACTURING METHOD THEREOF

CROSS-REFERENCE TO RELATED APPLICATIONS

This application is based upon and claims the benefit of priority from Japanese Patent Application No. 2022-189979, filed Nov. 29, 2022, the entire contents of which are incorporated herein by reference.

FIELD

Embodiments described herein relate generally to a display device and a manufacturing method thereof.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole transport layer and an electron transport layer in addition to a light emitting layer.

In the process of manufacturing such a display element, a technique which prevents the reduction in reliability is required.

BRIEF DESCRIPTION OF THE DRAWINGS

FIG. 1 is a diagram showing a configuration example of a display device DSP.

FIG. 3 is a schematic cross-sectional view of the display device DSP along the A-B line of FIG. 2.

FIG. 5 is a cross-sectional view in which the lower electrode LE1 shown in FIG. 4 is enlarged.

FIG. 6 is a diagram for explaining the formation method of the lower electrode LE1.

FIG. 7 is a diagram for explaining the formation method of a first metal layer ML1 and a second metal layer ML2.

FIG. 8 is a diagram showing the relationship between the pressure at the time of the formation of a metal layer and the etching rate at the time of the etching of the metal layer.

FIG. 9 is a diagram showing the relationship between the power density at the time of the formation of a metal layer and the etching rate at the time of the etching of the metal layer.

FIG. 10 is a diagram for explaining the formation method of the lower electrode LE1.

FIG. 11 is a diagram for explaining the formation method of the lower electrode LE1.

FIG. 12 is a diagram for explaining the formation method of the lower electrode LE1.

FIG. 13 is a diagram for explaining the formation method of the lower electrode LE1.

FIG. 14 is a diagram for explaining the formation method of the lower electrode LE1.

FIG. 15 is a diagram for explaining the manufacturing method of the display device DSP.

FIG. 16 is a diagram for explaining the manufacturing method of the display device DSP.

FIG. 17 is a diagram for explaining the manufacturing method of the display device DSP.

FIG. 18 is a diagram for explaining the manufacturing method of the display device DSP.

FIG. 19 is a diagram for explaining the manufacturing method of the display device DSP.

FIG. 20 is a diagram for explaining the manufacturing method of the display device DSP.

FIG. 21 is a diagram for explaining the manufacturing method of the display device DSP.

FIG. 22 is a diagram for explaining the manufacturing method of the display device DSP.

FIG. 23 is a diagram for explaining the manufacturing method of the display device DSP.

FIG. 24 is a diagram for explaining the manufacturing method of the display device DSP.

DETAILED DESCRIPTION

Figure 2:
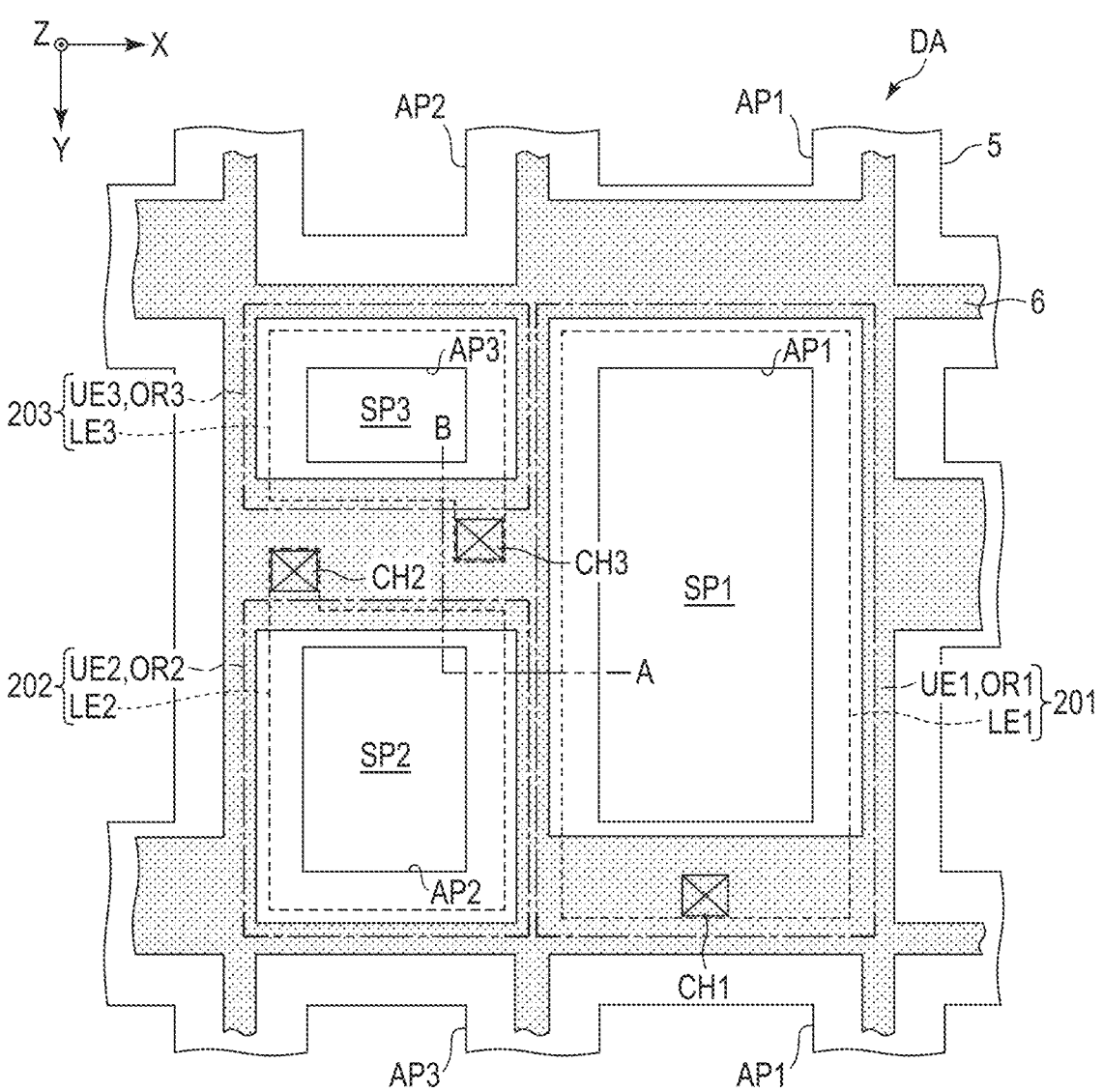
FIG. 2 is a diagram showing an example of the layout of subpixels SP1, SP2 and SP3.

Embodiments described herein aim to provide a display device and a manufacturing method thereof such that the reduction in reliability can be prevented.

In general, according to one embodiment, a manufacturing method of a display device, comprising forming a lower electrode, forming an organic layer located on the lower electrode and including a light emitting layer, and forming an upper electrode located on the organic layer. The lower electrode is formed by forming a first conductive oxide layer, forming a first metal layer on the first conductive oxide layer at a first pressure, forming a second metal layer on the first metal layer at a second pressure different from the first pressure, forming a second conductive oxide layer on the second metal layer, forming a resist having a predetermined shape on the second conductive oxide layer, etching the second conductive oxide layer using the resist as a mask, retracting an end portion of the second metal layer relative to an end portion of the second conductive oxide layer and an edge of a lower surface of the first metal layer by etching the second metal layer and the first metal layer using the resist as a mask, etching the first conductive oxide layer using the resist as a mask, and removing the resist.

According to another embodiment, a display device comprises a substrate, a lower electrode provided above the substrate, an organic layer provided on the lower electrode and including a light emitting layer, and an upper electrode provided on the organic layer. The lower electrode comprises a first transparent electrode, a metal electrode provided on the first transparent electrode, and a second transparent electrode provided on the metal electrode. An edge of an upper surface of the metal electrode is retracted relative to an edge of a lower surface of the metal electrode. An end portion of the second transparent electrode is retracted relative to the edge of the upper surface of the metal electrode.

The embodiments provide a display device and a manufacturing method thereof such that the reduction in reliability can be prevented.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. When various elements are viewed parallel to the third direction Z, the appearance is defined as a plan view.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA located on an external side relative to the display area DA on an insulating substrate 10. The substrate 10 may be glass or a resinous film having flexibility.

In the present embodiment, the substrate 10 is rectangular in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element.

The surrounding area SA comprises a terminal area TA for connecting an IC chip and a flexible printed circuit. The terminal area TA comprises a plurality of pads (terminals) PD. The pads PD are connected to the terminal of the IC chip and the terminal of the flexible printed circuit.

FIG. 2 is a diagram showing an example of the layout of subpixels SP1, SP2 and SP3.

In the example of FIG. 2, subpixels SP2 and SP3 are arranged in the second direction Y. Subpixels SP1 and SP2 are arranged in the first direction X, and subpixels SP1 and SP3 are arranged in the first direction X.

When subpixels SP1, SP2 and SP3 are provided in line with this layout, in the display area DA, a column in which subpixels SP2 and SP3 are alternately provided in the second direction Y and a column in which a plurality of subpixels SP1 are provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively.

The partition 6 overlaps the rib 5 in plan view. The partition 6 is formed into a grating shape surrounding the apertures AP1, AP2 and AP3. In other words, the partition 6 comprises apertures in subpixels SP1, SP2 and SP3 in a manner similar to that of the rib 5.

Subpixels SP1, SP2 and SP3 comprise display elements 201, 202 and 203, respectively, as the display elements 20.

The display element 201 of subpixel SP1 comprises a lower electrode LE1, an upper electrode UE1 and an organic layer OR1 overlapping the aperture AP1. The peripheral portion of the lower electrode LE1 is covered with the rib 5. The organic layer OR1 and the upper electrode UE1 are surrounded by the partition 6. The peripheral portion of each of the organic layer OR1 and the upper electrode UE1 overlaps the rib 5 in plan view. The organic layer OR1 includes a light emitting layer which emits light in, for example, a blue wavelength range.

The display element 202 of subpixel SP2 comprises a lower electrode LE2, an upper electrode UE2 and an organic layer OR2 overlapping the aperture AP2. The peripheral portion of the lower electrode LE2 is covered with the rib 5. The organic layer OR2 and the upper electrode UE2 are surrounded by the partition 6. The peripheral portion of each of the organic layer OR2 and the upper electrode UE2 overlaps the rib 5 in plan view. The organic layer OR2 includes a light emitting layer which emits light in, for example, a green wavelength range.

The display element 203 of subpixel SP3 comprises a lower electrode LE3, an upper electrode UE3 and an organic layer OR3 overlapping the aperture AP3. The peripheral portion of the lower electrode LE3 is covered with the rib 5. The organic layer OR3 and the upper electrode UE3 are surrounded by the partition 6. The peripheral portion of each of the organic layer OR3 and the upper electrode UE3 overlaps the rib 5 in plan view. The organic layer OR3 includes a light emitting layer which emits light in, for example, a red wavelength range.

In the example of FIG. 2, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. It should be noted that the outer shapes of the lower electrodes, organic layers or upper electrodes shown in the figure do not necessarily reflect the accurate shapes.

The lower electrodes LE1, LE2 and LE3 correspond to, for example, the anodes of the display elements. The upper electrodes UE1, UE2 and UE3 correspond to the cathodes of the display elements or a common electrode.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the area of the aperture AP1, the area of the aperture AP2 and the area of the aperture AP3 are different from each other. The area of the aperture AP1 is greater than that of the aperture AP2, and the area of the aperture AP2 is greater than that of the aperture AP3. In other words, the area of the lower electrode LE1 exposed from the aperture AP1 is greater than that of the lower electrode LE2 exposed from the aperture AP2. The area of the lower electrode LE2 exposed from the aperture AP2 is greater than that of the lower electrode LE3 exposed from the aperture AP3.

FIG. 3 is a schematic cross-sectional view of the display device DSP along the A-B line of FIG. 2.

A circuit layer 11 is provided on the substrate 10. The circuit layer 11 includes various circuits such as the pixel circuit 1 shown in FIG. 1 and various lines such as the scanning line GL, the signal line SL and the power line PL. The circuit layer 11 is covered with an insulating layer 12. The insulating layer 12 is an organic insulating layer which planarizes the irregularities formed by the circuit layer 11.

The lower electrodes LE1, LE2 and LE3 are provided on the insulating layer 12. The details of the lower electrodes LE1, LE2 and LE3 are described later.

The rib 5 is provided on the insulating layer 12 and the lower electrodes LE1, LE2 and LE3. The aperture AP1 of the rib 5 overlaps the lower electrode LE1. The aperture AP2 overlaps the lower electrode LE2. The aperture AP3 overlaps the lower electrode LE3. The peripheral portion of each of the lower electrodes LE1, LE2 and LE3 is covered with the rib 5. Between, of the lower electrodes LE1, LE2 and LE3, the lower electrodes which are adjacent to each other, the insulating layer 12 is covered with the rib 5.

The partition 6 includes a conductive lower portion 61 provided on the rib 5 and an upper portion 62 provided on the lower portion 61. The lower portion 61 of the partition 6 shown on the right side of the figure is located between the aperture AP1 and the aperture AP2. The lower portion 61 of the partition 6 shown on the left side of the figure is located between the aperture AP2 and the aperture AP3. The upper portion 62 has a width greater than that of the lower portion 61. The both end portions of the upper portion 62 protrude relative to the side surfaces of the lower portion 61. This shape of the partition 6 is called an overhang shape.

The organic layer OR1 is in contact with the lower electrode LE1 through the aperture AP1 and covers the lower electrode LE1 exposed from the aperture AP1. The peripheral portion of the organic layer OR1 is located on the rib 5. The upper electrode UE1 covers the organic layer OR1 and is in contact with the lower portion 61.

The organic layer OR2 is in contact with the lower electrode LE2 through the aperture AP2 and covers the lower electrode LE2 exposed from the aperture AP2. The peripheral portion of the organic layer OR2 is located on the rib 5. The upper electrode UE2 covers the organic layer OR2 and is in contact with the lower portion 61.

The organic layer OR3 is in contact with the lower electrode LE3 through the aperture AP3 and covers the lower electrode LE3 exposed from the aperture AP3. The peripheral portion of the organic layer OR3 is located on the rib 5. The upper electrode UE3 covers the organic layer OR3 and is in contact with the lower portion 61.

In the example of FIG. 3, subpixel SP1 comprises a cap layer CP1 and a sealing layer SE1. Subpixel SP2 comprises a cap layer CP2 and a sealing layer SE2. Subpixel SP3 comprises a cap layer CP3 and a sealing layer SE3. The cap layers CP1, CP2 and CP3 function as optical adjustment layers which improve the extraction efficiency of the light emitted from the organic layers OR1, OR2 and OR3, respectively.

The cap layer CP1 is provided on the upper electrode UE1.

The cap layer CP2 is provided on the upper electrode UE2.

The cap layer CP3 is provided on the upper electrode UE3.

The sealing layer SE1 is provided on the cap layer CP1, is in contact with the partition 6 and continuously covers each member of subpixel SP1.

The sealing layer SE2 is provided on the cap layer CP2, is in contact with the partition 6 and continuously covers each member of subpixel SP2.

The sealing layer SE3 is provided on the cap layer CP3, is in contact with the partition 6 and continuously covers each member of subpixel SP3.

In the example of FIG. 3, the organic layer OR1, the upper electrode UE1 and the cap layer CP1 are partly located on the partition 6 around subpixel SP1. These portions are spaced apart from, of the organic layer OR1, the upper electrode UE1 and the cap layer CP1, the portions located in the aperture AP1 (the portions constituting the display element 201).

Similarly, the organic layer OR2, the upper electrode UE2 and the cap layer CP2 are partly located on the partition 6 around subpixel SP2. These portions are spaced apart from, of the organic layer OR2, the upper electrode UE2 and the cap layer CP2, the portions located in the aperture AP2 (the portions constituting the display element 202).

Similarly, the organic layer OR3, the upper electrode UE3 and the cap layer CP3 are partly located on the partition 6 around subpixel SP3. These portions are spaced apart from, of the organic layer OR3, the upper electrode UE3 and the cap layer CP3, the portions located in the aperture AP3 (the portions constituting the display element 203).

The end portions of the sealing layers SE1, SE2 and SE3 are located above the partition 6. In the example of FIG. 3, the end portions of the sealing layers SE1 and SE2 located above the partition 6 between subpixels SP1 and SP2 are spaced apart from each other. The end portions of the sealing layers SE2 and SE3 located above the partition 6 between subpixels SP2 and SP3 are spaced apart from each other.

The sealing layers SE1, SE2 and SE3 are covered with a resin layer 13. The resin layer 13 is covered with a sealing layer 14. The sealing layer 14 is covered with a resin layer 15.

Each of the sealing layers SE1, SE2 and SE3 and the sealing layer 14 is formed of, for example, an inorganic insulating material such as silicon nitride (SiNx). Each of the sealing layers SE1, SE2 and SE3 and the sealing layer 14 may be formed of another inorganic insulating material such as silicon oxide (SiOx), silicon oxynitride (SiON) or aluminum oxide ($Al_2O_3$).

The rib 5 is formed of an inorganic insulating material such as silicon oxide (SiOx), silicon oxynitride (SiON), silicon nitride (SiNx) or aluminum oxide ($Al_2O_3$).

The lower portion 61 of the partition 6 is formed of a conductive material and is electrically connected to the upper electrodes UE1, UE2 and UE3. Both the lower portion 61 and the upper portion 62 of the partition 6 may be formed of conductive materials.

The organic layer OR1 includes a light emitting layer EM1. The organic layer OR2 includes a light emitting layer EM2. The organic layer OR3 includes a light emitting layer EM3. The light emitting layer EM1, the light emitting layer EM2 and the light emitting layer EM3 are formed of materials which are different from each other. For example, the light emitting layer EM1 is formed of a material which emits light in a blue wavelength range. The light emitting layer EM2 is formed of a material which emits light in a green wavelength range. The light emitting layer EM3 is formed of a material which emits light in a red wavelength range.

Each of the organic layers OR1, OR2 and OR3 includes a plurality of functional layers such as a hole injection layer, a hole transport layer, an electron blocking layer, a hole blocking layer, an electron transport layer and an electron injection layer.

Each of the upper electrodes UE1, UE2 and UE3 is formed of, for example, a metal material such as an alloy of magnesium and silver (MgAg).

Each of the cap layers CP1, CP2 and CP3 is a multilayer body consisting of a plurality of thin films. All of the thin films are transparent and have refractive indices different from each other.

Figure 4:
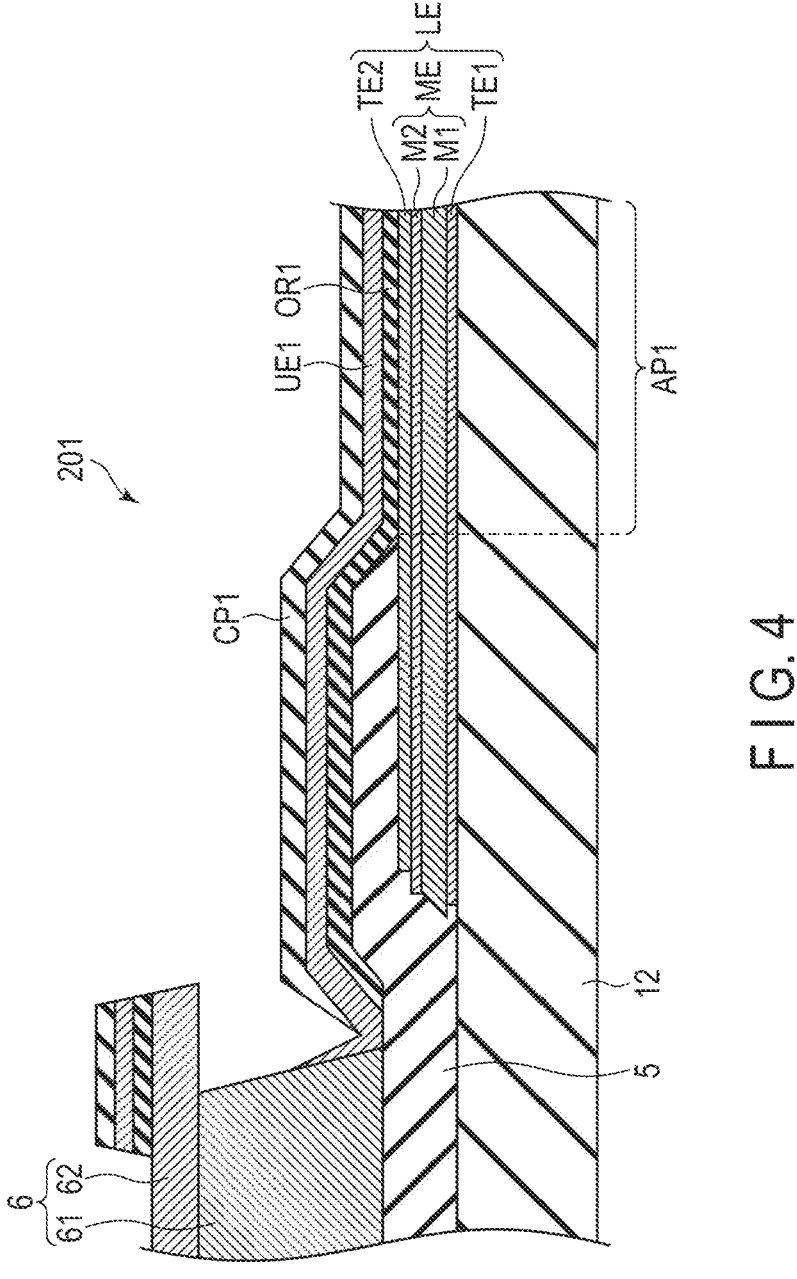
FIG. 4 is a cross-sectional view showing a configuration example of a lower electrode LE1.

FIG. 4 is a cross-sectional view showing a configuration example of the lower electrode LE1. In FIG. 4, the illustrations of the layers lower than the insulating layer 12 are omitted, and the illustrations of the layers higher than the cap layer CP1 are omitted.

The lower electrode LE1 comprises a first transparent electrode TE1, a metal electrode ME and a second transparent electrode TE2.

The first transparent electrode TE1 is provided on the insulating layer 12.

The metal electrode ME is provided on the first transparent electrode TE1. The metal electrode ME is a stacked layer body of a first electrode M1 and a second electrode M2. The first electrode M1 is provided on the first transparent electrode TE1. The second electrode M2 is provided on the first electrode M1.

The second transparent electrode TE2 is provided on the metal electrode ME (or the second electrode M2). The second transparent electrode TE2 is exposed in the aperture AP1 of the rib 5 and is covered with the organic layer OR1.

Each of the first transparent electrode TE1 and the second transparent electrode TE2 is formed of indium tin oxide (ITO) or indium zinc oxide (IZO). The first transparent electrode TE1 and the second transparent electrode TE2 may be formed of different materials or may be formed of the same material.

Each of the first and second electrodes M1 and M2 of the metal electrode ME is formed of silver or a silver alloy. The first electrode M1 and the second electrode M2 may be formed of different materials or may be formed of the same material.

FIG. 5 is a cross-sectional view in which the lower electrode LE1 shown in FIG. 4 is enlarged.

The first electrode M1 comprises a lower surface Ma which is in contact with the first transparent electrode TE1, an upper surface Mb which is in contact with the second electrode M2, and an end portion MS1 between the edge E1 of the lower surface Ma and the edge E2 of the upper surface Mb. The lower surface Ma corresponds to the lower surface of the metal electrode ME. The edge E2 is retracted relative to the edge E1. In the example shown in the figure, the end portion MS1 is an inclined surface. It should be noted that the end portion MS1 is not limited to a flat surface and may be a curved surface (a concave surface or a convex surface). The angle θ made by the end portion MS1 (or an imaginary line connecting the edge E1 and the edge E2) and the lower surface Ma is an acute angle.

The end portion TS1 of the first transparent electrode TE1 is retracted relative to the edge E1 of the lower surface Ma. In other words, the first electrode M1 is formed into an overhang shape protruding from the end portion TS1 of the first transparent electrode TE1.

The second electrode M2 comprises an upper surface Mc which is in contact with the second transparent electrode TE2, and an end portion MS2. The upper surface Mc corresponds to the upper surface of the metal electrode ME. The edge E3 of the upper surface Mc is retracted relative to the edge E1. The end portion MS2 is located immediately above the edge E2. However, the end portion MS2 may be retracted relative to the edge E2.

The end portion TS2 of the second transparent electrode TE2 is retracted relative to the edge E3 of the upper surface Mc (or the end portion MS2 of the second electrode M2). In other words, the second electrode M2 protrudes from the end portion TS2 of the second transparent electrode TE2. Thus, part of the upper surface Mc, specifically, of the upper surface Mc, the area located between the end portion MS2 and the end portion TS2, is exposed from the second transparent electrode TE2.

Now, this specification explains the relationships of thickness T1 of the first transparent electrode TE1, thickness T2 of the first electrode M1, thickness T3 of the second electrode M2 and thickness T4 of the second transparent electrode TE2.

When this specification focuses attention on the first transparent electrode TE1 and the second transparent electrode TE2, thickness T4 is greater than thickness T1 (T1<T4). It should be noted that thickness T4 may be equal to thickness T1.

When this specification focuses attention on the first and second electrodes M1 and M2 of the metal electrode ME, thickness T3 is less than thickness T2 (T2>T3).

Thickness T2 is greater than thickness T1 (T1<T2).

For example, thickness T1 is 5 to 10 nm. Thickness T4 is 5 to 50 nm.

Thickness T2 is 90 nm. Thickness T3 is 10 nm. The thickness of the metal electrode ME is the sum of thickness T2 and thickness T3 and is approximately 100 nm.

In this manner, in the present embodiment, the end portion MS1 is a surface which inclines at angle θ. Further, the end portion TS2 is retracted relative to the edge E3. By this configuration, the end portion of the lower electrode LE1 is formed as a gentle slope as shown by the dotted line of FIG. 5. In other words, the lower electrode LE1 is formed so as to comprise a section having a forward tapered shape.

If angle θ shown in FIG. 5 is an obtuse angle or a right angle in the lower electrode LE1, a crack may be generated in the rib 5 based on the end portion of the lower electrode LE1. In particular, when the rib 5 is formed of an inorganic insulating material, a crack is easily generated.

The crack of the rib 5 could be the dispersion path of the moisture contained in the insulating layer 12. The insulating layer 12 is an organic insulating layer and has a high permeability compared to inorganic insulating layers. Therefore, if a crack is generated in the rib 5 based on the end portion of the lower electrode LE1, the moisture of the insulating layer 12 may pass through the crack via the end portion of the lower electrode LE1. When the crack penetrates the rib 5, the organic layer OR1 located on the rib 5 is damaged by the moisture dispersed from the insulating layer 12, thereby causing the degradation of the organic layer OR1. In some cases, the upper electrode UE1 is in contact with the lower electrode LE1 through the crack, thereby causing undesired defective conduction.

In consideration of these matters, in the present embodiment, the lower electrode LE1 is formed so as to comprise a section having a forward tapered shape, and angle θ is formed so as to be an acute angle in the end portion of the lower electrode LE1. Thus, the end portion of the lower electrode LE1 is assuredly covered with the rib 5, thereby preventing the formation of a crack in the rib 5. This configuration prevents the degradation of the organic layer OR1 based on the moisture contained in the insulating layer 12. Further, undesired defective conduction between the lower electrode LE1 and the upper electrode UE1 is prevented.

In this manner, the reduction in reliability can be prevented.

In the above description, the lower electrode LE1 is explained with reference to FIG. 4 and FIG. 5. The lower electrodes LE2 and LE3 are configured in a manner similar to that of the lower electrode LE1. Similar effects are obtained in the display elements 202 and 203.

Now, this specification explains the formation method of the lower electrode LE1.

First, as shown in FIG. 6, after the circuit layer 11 is formed on the substrate 10, the insulating layer 12 is formed.

Subsequently, a first conductive oxide layer TL1 is formed on the insulating layer 12.

Subsequently, a first metal layer ML1 is formed on the first conductive oxide layer TL1.

Subsequently, a second metal layer ML2 is formed on the first metal layer ML1.

Subsequently, a second conductive oxide layer TL2 is formed on the second metal layer ML2.

The first transparent electrode TE1, first electrode M1, second electrode M2 and second transparent electrode TE2 shown in FIG. 5 are formed by patterning the first conductive oxide layer TL1, first metal layer ML1, second metal layer ML2 and second conductive oxide layer TL2 shown in FIG. 6, respectively.

Thickness T1 of the first conductive oxide layer TL1, thickness T2 of the first metal layer ML1, thickness T3 of the second metal layer ML2 and thickness T4 of the second conductive oxide layer TL2 correspond to thicknesses T1 to T4 explained with reference to FIG. 5, respectively.

Each of the first conductive oxide layer TL1 and the second conductive oxide layer TL2 is formed of ITO or IZO. Here, each of them is formed of ITO by sputtering.

Each of the first metal layer ML1 and the second metal layer ML2 is formed of silver or a silver alloy. Here, each of them is formed of silver by sputtering.

Now, this specification explains the formation method of the first metal layer ML1 and the second metal layer ML2 with reference to FIG. 7.

The sputtering device 100 shown in the center of FIG. 7 comprises a chamber 101, a gas supply source 102 which introduces an inactive gas into the chamber 101, an evacuation mechanism 103 which removes the gas of the inside of the chamber 101, and a target 104 accommodated in the chamber 101.

The gas supply source 102 is configured to introduce an inactive gas such as argon (Ar), krypton (Kr) or xenon (Xe) into the chamber 101. The pressure of the inside of the chamber 101 can be adjusted by the ratio between the flow rate of the gas supplied from the gas supply source 102 and the amount of evacuation by the evacuation mechanism 103.

First, as shown on the left side of FIG. 7, a processing substrate SUB in which the first conductive oxide layer TL1 is formed on the insulating layer 12 is prepared.

Subsequently, as shown in the center of FIG. 7, the processing substrate SUB is carried in the chamber 101 of the sputtering device 100, and the processing substrate SUB is placed so as to face the target 104. Subsequently, an inactive gas is introduced into the chamber 101, and the pressure of the inside of the chamber 101 is set so as to be a first pressure. Subsequently, high voltage is applied between the target 104 and the processing substrate SUB. The silver dispersed from the target 104 is attached onto the first conductive oxide layer TL1. In this manner, the first metal layer ML1 is formed.

After the first metal layer ML1 having thickness T2 is formed, the pressure of the inside of the chamber 101 is set so as to be a second pressure. The second pressure is different from the first pressure and is greater than the first pressure. Subsequently, high voltage is applied between the target 104 and the processing substrate SUB. The silver dispersed from the target 104 is attached onto the first metal layer ML1. In this manner, the second metal layer ML2 is formed.

After the second metal layer ML2 having thickness T3 is formed, as shown on the right side of FIG. 7, the processing substrate SUB is carried out of the chamber 101.

Subsequently, the second conductive oxide layer TL2 is formed on the second metal layer ML2. In this manner, the cross-sectional structure shown in FIG. 6 is obtained. As shown in FIG. 6, thickness T3 is less than thickness T2. Thickness T4 is greater than thickness T1. Thickness T2 is greater than thickness T1. Thickness T3 is less than thickness T4.

When densities are compared between the first and second metal layers ML1 and ML2 formed at different pressures, the density of the second metal layer ML2 formed at a high pressure is less than that of the first metal layer ML1 formed at a low pressure. Therefore, when the first metal layer ML1 and the second metal layer ML2 are etched on the same condition, the etching rate of the second metal layer ML2 is faster than that of the first metal layer ML1. The etching rates of the first metal layer ML1 and the second metal layer ML2 are described in detail later.

FIG. 8 is a diagram showing the relationship between the pressure at the time of the formation of a metal layer and the etching rate at the time of the etching of the metal layer.

In the figure, the horizontal axis indicates the pressure (Pa) of the inside of the chamber 101. In the figure, the vertical axis indicates the etching rate (nm/sec). The etching rate corresponds to the thickness of the metal layer removed by etching per unit time.

The measurement result shown in FIG. 8 was obtained by the following experiment.

A plurality of samples were prepared by forming a metal layer using silver on a substrate at different pressures. The power density at the time of the formation of the metal layer was the same in all samples and was 1.0 W/cm². The power density is the discharge power of the target 104 per unit area.

Regarding each of these samples, the metal layer was etched by a mixed acid in which phosphoric acid, nitric acid and acetic acid were the main components, and the etching rate was measured.

Regarding the samples in which each metal layer was formed at a pressure from 0.2 Pa to 3.0 Pa, it was confirmed that the etching rate increased with increasing pressure. The following matters were also confirmed. The amount of change in the etching rate was less when the pressure was in the range from 0.2 Pa to 1.0 Pa. The amount of change in the etching rate was great when the pressure exceeded 1.0 Pa.

FIG. 9 is a diagram showing the relationship between the power density at the time of the formation of a metal layer and the etching rate at the time of the etching of the metal layer.

In the figure, the horizontal axis indicates the power density (W/cm²). In the figure, the vertical axis indicates the etching rate (nm/sec).

The measurement result shown in FIG. 9 was obtained by the following experiment.

A plurality of samples were prepared by forming a metal layer using silver on a substrate with different power densities. The pressure of the inside of the chamber 101 at the time of the formation of the metal layer was the same in all samples and was 0.2 Pa.

Regarding each of these samples, the metal layer was etched by a mixed acid in which phosphoric acid, nitric acid and acetic acid were the main components, and the etching rate was measured.

It was confirmed that the etching rate was substantially constant regarding the samples in which the respective metal layers were formed with different power densities.

For example, JP H09-197435 A discloses the relationship between the discharge power and the etching rate regarding molybdenum tungsten alloy. This document discloses that, regarding molybdenum tungsten alloy, the density of molybdenum tungsten alloy becomes coarse by increasing the discharge power, and the etching rate increases.

In the present embodiment, according to the analysis of the inventor, regarding silver, the etching rate did not substantially change even if the power density was increased. Thus, the following matter can be presumed. Even if the power density is changed, the density of silver does not substantially change. In this manner, the relationship between the pressure and the etching rate or the relationship between the power density and the etching rate does not necessarily show the same tendency in all metal materials.

This specification returns to the explanation of the formation method of the lower electrode LE1. It should be noted that the illustrations of the layers lower than the insulating layer 12 are omitted in FIG. 10 and the subsequent figures.

After the formation of the first conductive oxide layer TL1, first metal layer ML1, second metal layer ML2 and second conductive oxide layer TL2 shown in FIG. 6, as shown in FIG. 10, a resist R1 having a predetermined shape is formed on the second conductive oxide layer TL2.

Subsequently, as shown in FIG. 11, the second conductive oxide layer TL2 is etched using the resist R1 as a mask. This etching is, for example, wet etching using an etchant in which oxalic acid is the main component.

Subsequently, as shown in FIG. 12, after the second metal layer ML2 is etched using the resist R1 as a mask, the first metal layer ML1 is successively etched. This etching is, for example, wet etching using an etchant of a mixed acid in which phosphoric acid, nitric acid and acetic acid are the main components.

In this etching, the second metal layer ML2 is removed such that the end portion MS2 is retracted relative to the end portion TS2 of the second conductive oxide layer TL2 and the edge E1 of the lower surface Ma of the first metal layer ML1. By this process, the second electrode M2 is formed.

Further, in this etching, the first metal layer ML1 is removed such that the edge E2 of the upper surface Mb is retracted relative to the edge E1 of the lower surface Ma. By this process, the first electrode M1 comprising the end portion MS1 which is an inclined surface is formed.

Subsequently, as shown in FIG. 13, the first conductive oxide layer TL1 is etched using the resist R1 as a mask. At this time, the second conductive oxide layer TL2 is also etched. This etching is, for example, wet etching using an etchant in which oxalic acid is the main component.

In this etching, the second conductive oxide layer TL2 is removed such that the end portion TS2 is retracted relative to the end portion MS2 of the second electrode M2 (or the edge E3 of the upper surface Mc). By this process, the second transparent electrode TE2 is formed.

In this etching, the first conductive oxide layer TL1 is removed such that the end portion TS1 is retracted relative to the edge E1 of the lower surface Ma. By this process, the first transparent electrode TE1 is formed.

To cover the lower electrode LE1 without generating a crack in the rib 5, the length of the retraction of the end portion TS1 from the edge E1 (the distance from the end portion TS1 to the edge E1) should be preferably short. Further, the end portion TS1 and the edge E1 should preferably overlap each other. To obtain this structure, the reduction in thickness T1 of the first conductive oxide layer TL1 is effective. For example, when thickness T1 is less than or equal to 10 nm, the length of the retraction can be also approximately 10 nm or substantially 0.

Subsequently, as shown in FIG. 14, the resist R1 is removed. By this process, the lower electrode LE1 is formed.

Now, this specification explains the manufacturing method of the display device DSP.

As shown in FIG. 15, the lower electrode LE1 of subpixel SP1, the lower electrode LE2 of subpixel SP2 and the lower electrode LE3 of subpixel SP3 are formed on the insulating layer 12. These lower electrodes LE1, LE2 and LE3 are formed by applying the formation method of the lower electrode LE1 described above.

Subsequently, an inorganic insulating material is deposited over the entire display area DA to form an insulating layer IL which covers the lower electrodes LE1 and LE2. The insulating layer IL is formed by, for example, chemical vapor deposition (CVD).

Subsequently, a first layer L1 including a conductive layer is formed on the insulating layer IL. Subsequently, a second layer L2 is formed on the first layer L1. The conductive layer of the first layer L1 is formed of a conductive material such as aluminum. The second layer L2 may be formed of a conductive material or may be formed of an insulating material. Subsequently, a resist R2 having a predetermined shape is formed on the second layer L2.

Subsequently, as shown in FIG. 16, the second layer L2 is patterned by etching using the resist R2 as a mask. By this process, the upper portion 62 constituting the partition is formed.

Subsequently, as shown in FIG. 17, the first layer L1 is patterned by anisotropic etching and isotropic etching using the resist R2 as a mask. By this process, the lower portion 61 constituting the partition 6 is formed. Subsequently, the resist R2 is removed.

Subsequently, as shown in FIG. 18, the apertures AP1, AP2 and AP3 which overlap the lower electrodes LE1, LE2 and LE3 are formed by patterning the insulating layer IL.

For example, the insulating layer IL is partly removed by anisotropic dry etching using the upper portion 62 of the partition 6 as a mask to form the rib 5 comprising the apertures AP1, AP2 and AP3.

As another example, after forming a resist which individually covers the partition 6, anisotropic dry etching may be performed to remove, of the insulating layer IL, the portion exposed from the resist. Subsequently, the resist may be removed to form the rib 5 comprising the aperture AP1, etc.

Alternatively, after the formation of the aperture AP1, etc., of the rib 5, the partition 6 may be formed.

Subsequently, the display element 201 is formed.

First, as shown in FIG. 19, the organic layer OR1 is formed by depositing the materials for forming the hole injection layer, the hole transport layer, the electron blocking layer, the light emitting layer (EM1), the hole blocking layer, the electron transport layer, the electron injection layer, etc., on the lower electrode LE1 in series.

Subsequently, the upper electrode UE1 is formed by depositing a mixture of magnesium and silver on the organic layer OR1. The upper electrode UE1 covers the organic layer OR1 and is in contact with the side surface of the lower portion 61.

Subsequently, the cap layer CP1 is formed by depositing a high-refractive material and a low-refractive material on the upper electrode UE1.

Subsequently, the sealing layer SE1 is formed so as to continuously cover the cap layer CP1 and the partition 6.

The organic layer OR1, the upper electrode UE1, the cap layer CP1 and the sealing layer SE1 are formed in at least the entire display area DA and are provided in subpixels SP2 and SP3 as well as subpixel SP1. The organic layer OR1, the upper electrode UE1 and the cap layer CP1 are divided by the partition 6 having an overhang shape.

The materials which are emitted from an evaporation source when the organic layer OR1, the upper electrode UE1 and the cap layer CP1 are formed by vapor deposition are blocked by the upper portion 62. Thus, each of the organic layer OR1, the upper electrode UE1 and the cap layer CP1 is partly stacked on the upper portion 62.

Subsequently, as shown in FIG. 20, a resist R3 having a predetermined shape is formed on the sealing layer SE1. The resist R3 overlaps subpixel SP1 and part of the partition 6 around subpixel SP1.

Subsequently, as shown in FIG. 21, the sealing layer SE1, cap layer CP1, upper electrode UE1 and organic layer OR1 exposed from the resist R3 are removed in series by etching using the resist R3 as a mask. In this manner, the lower electrode LE2 of subpixel SP2 and the lower electrode LE3 of subpixel SP3 are exposed.

Subsequently, as shown in FIG. 22, the resist R3 is removed. By this process, the display element 201 is formed in subpixel SP1.

Subsequently, as shown in FIG. 23, the display element 202 is formed. The procedure of forming the display element 202 is similar to that of forming the display element 201. Specifically, the organic layer OR2 including the light emitting layer EM2, the upper electrode UE2, the cap layer CP2 and the sealing layer SE2 are formed in order on the lower electrode LE2. Subsequently, a resist is formed on the sealing layer SE2. The sealing layer SE2, the cap layer CP2, the upper electrode UE2 and the organic layer OR2 are patterned in series by etching using the resist as a mask. After this patterning, the resist is removed. In this manner, the display element 202 is formed in subpixel SP2, and the lower electrode LE3 of subpixel SP3 is exposed.

Subsequently, as shown in FIG. 24, the display element 203 is formed. The procedure of forming the display element 203 is similar to that of forming the display element 201. Specifically, the organic layer OR3 including the light emitting layer EM3, the upper electrode UE3, the cap layer CP3 and the sealing layer SE3 are formed in order on the lower electrode LE3. Subsequently, a resist is formed on the sealing layer SE3. The sealing layer SE3, the cap layer CP3, the upper electrode UE3 and the organic layer OR3 are patterned in series by etching using the resist as a mask. After this patterning, the resist is removed. By this process, the display element 203 is formed in subpixel SP3.

Subsequently, the resin layer 13, sealing layer 14 and resin layer 15 shown in FIG. 3 are formed in order. By this process, the display device DSP is completed. In the manufacturing process described above, this specification assumes a case where the display element 201 is formed firstly, and the display element 202 is formed secondly, and the display element 203 is formed lastly. However, the formation order of the display elements 201, 202 and 203 is not limited to this example.

As explained above, the present embodiment can provide a display device and a manufacturing method of a display device such that the reduction in reliability can be prevented.

All of the display devices and manufacturing methods thereof that can be implemented by a person of ordinary skill in the art through arbitrary design changes to the display device and manufacturing method thereof described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiment and are self-explanatory from the descriptions of the specification or can be arbitrarily conceived by a person of ordinary skill in the art are considered as the effects of the present invention as a matter of course.

What is claimed is:

1. A manufacturing method of a display device, comprising:

forming a lower electrode;

forming an organic layer located on the lower electrode and including a light emitting layer; and forming an upper electrode located on the organic layer, wherein the lower electrode is formed by:

forming a first conductive oxide layer;

forming a first metal layer on the first conductive oxide layer at a first pressure;

forming a second metal layer on the first metal layer at a second pressure different from the first pressure;

forming a second conductive oxide layer on the second metal layer;

forming a resist having a predetermined shape on the second conductive oxide layer;

etching the second conductive oxide layer using the resist as a mask;

retracting an end portion of the second metal layer relative to an end portion of the second conductive oxide layer and an edge of a lower surface of the first metal layer by etching the second metal layer and the first metal layer using the resist as a mask;

etching the first conductive oxide layer using the resist as a mask; and removing the resist.

2. The manufacturing method of claim 1, wherein each of the first conductive oxide layer and the second conductive oxide layer is formed of indium tin oxide (ITO) or indium zinc oxide (IZO).

3. The manufacturing method of claim 1, wherein each of the first metal layer and the second metal layer is formed of silver or a silver alloy.

4. The manufacturing method of claim 1, wherein the second pressure is greater than the first pressure.

5. The manufacturing method of claim 1, wherein a thickness of the second metal layer is less than a thickness of the first metal layer.

6. The manufacturing method of claim 1, wherein a thickness of the second conductive oxide layer is greater than a thickness of the first conductive oxide layer.

7. The manufacturing method of claim 1, wherein a thickness of the first metal layer is greater than a thickness of the first conductive oxide layer.

8. The manufacturing method of claim 1, wherein when the first conductive oxide layer is etched, the end portion of the second conductive oxide layer is retracted relative to the end portion of the second metal layer.

9. The manufacturing method of claim 1, further comprising forming a rib which covers a peripheral portion of the lower electrode after forming the lower electrode.

10. The manufacturing method of claim 9, wherein the rib is formed of an inorganic insulating material.

11. The manufacturing method of claim 10, further comprising forming a partition which comprises a lower portion located on the rib and formed of a conductive material and an upper portion located on the lower portion and protruding from a side surface of the lower portion.

12. The manufacturing method of claim 11, further comprising:

forming the organic layer on the lower electrode; and forming the upper electrode which covers the organic layer and is in contact with the lower portion of the partition.

13. A display device comprising:

a substrate;

a lower electrode provided above the substrate;

an organic layer provided on the lower electrode and including a light emitting layer; and an upper electrode provided on the organic layer, wherein the lower electrode comprises:

a first transparent electrode;

a metal electrode provided on the first transparent electrode; and a second transparent electrode provided on the metal electrode, an edge of an upper surface of the metal electrode is retracted relative to an edge of a lower surface of the metal electrode, and an end portion of the second transparent electrode is retracted relative to the edge of the upper surface of the metal electrode.

14. The display device of claim 13, wherein each of the first transparent electrode and the second transparent electrode is formed of indium tin oxide (ITO) or indium zinc oxide (IZO).

15. The display device of claim 13, wherein the metal electrode is formed of silver or a silver alloy.

16. The display device of claim 13, wherein an end portion of the first transparent electrode is retracted relative to the edge of the lower surface of the metal electrode.

17. The display device of claim 13, further comprising a rib which covers a peripheral portion of the lower electrode.

18. The display device of claim 17, wherein the rib is formed of an inorganic insulating material.

19. The display device of claim 18, further comprising a partition which comprises a lower portion located on the rib and formed of a conductive material and an upper portion located on the lower portion and protruding from a side surface of the lower portion.

20. The display device of claim 19, wherein the organic layer and the upper electrode are surrounded by the partition, a peripheral portion of the organic layer is provided on the rib, and the upper electrode covers the organic layer and is in contact with the lower portion of the partition.

* * * * *